(12) United States Patent
Kang et al.

(10) Patent No.: US 11,899,298 B2
(45) Date of Patent: Feb. 13, 2024

(54) DISPLAY DEVICE COMPRISING A LOCKING PROTRUSION PROTRUDING FROM AN OUTER LATERAL SIDE OF AN INNER FRAME

(71) Applicant: LG ELECTRONICS INC., Seoul (KR)

(72) Inventors: Minhyun Kang, Seoul (KR); Junhee Kong, Seoul (KR); Byungchun Yoo, Seoul (KR); Hyeongryeol Kim, Seoul (KR); Hyungu Kim, Seoul (KR); Subin Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/833,164

(22) Filed: Jun. 6, 2022

(65) Prior Publication Data
US 2022/0390788 A1 Dec. 8, 2022

(30) Foreign Application Priority Data

Jun. 7, 2021 (KR) .................. 10-2021-0073239

(51) Int. Cl.
*G02F 1/1333* (2006.01)
*H01L 25/16* (2023.01)

(52) U.S. Cl.
CPC .... *G02F 1/133314* (2021.01); *G02F 1/13332* (2021.01); *G02F 1/133317* (2021.01); *H01L 25/167* (2013.01)

(58) Field of Classification Search
None
See application file for complete search history.

(56) References Cited

U.S. PATENT DOCUMENTS

| 2012/0268686 | A1* | 10/2012 | Lee .................. G02F 1/133308 349/59 |
| 2013/0058020 | A1* | 3/2013 | Jo ........................ G02F 1/1345 361/679.01 |
| 2013/0088661 | A1* | 4/2013 | Shin .................. G02F 1/133308 349/62 |
| 2019/0196251 | A1* | 6/2019 | Woo .................. G02F 1/133308 |

FOREIGN PATENT DOCUMENTS

| JP | 2009229822 | 10/2009 |
| KR | 1020150072691 | 6/2015 |
| KR | 1020170050163 | 5/2017 |
| KR | 1020170114774 | 10/2017 |

OTHER PUBLICATIONS

PCT International Application No. PCT/KR2022/007800, International Search Report dated Sep. 22, 2022, 3 pages.

* cited by examiner

*Primary Examiner* — Paul C Lee
(74) *Attorney, Agent, or Firm* — LEE, HONG, DEGERMAN, KANG & WAIMEY

(57) ABSTRACT

Disclosed is a display device. The display device of the present disclosure includes: a display panel; a rear frame which is positioned in a rearward direction of the display panel; an inner frame which is positioned between the display panel and the rear frame, and coupled to the rear frame; and an outer frame which is coupled to the inner frame, and supports a rear surface of the display panel.

12 Claims, 30 Drawing Sheets

222

DISPLAY DEVICE COMPRISING A LOCKING PROTRUSION PROTRUDING FROM AN OUTER LATERAL SIDE OF AN INNER FRAME

CROSS-REFERENCE TO RELATED APPLICATION

Pursuant to 35 U.S.C. § 119(a), this application claims the benefit of earlier filing date and right of priority to Korean Patent Application No. 10-2021-0073239, filed on Jun. 7, 2021, the contents of which are hereby incorporated by reference herein in its entirety.

BACKGROUND OF THE INVENTION

1. Field of the Invention

The present disclosure relates to a display device.

2. Description of the Related Art

As the information society develops, the demand for display devices is also increasing in various forms. In response to this, various display devices such as Liquid Crystal Display Device (LCD), Organic Light Emitting Diode (OLED), and Micro LED have been researched and used in recent years.

Among them, the liquid crystal panel of the LCD includes a liquid crystal layer, and a TFT substrate and a color filter substrate facing each other with the liquid crystal layer interposed therebetween, and may display an image by using light provided from a backlight unit.

Recently, as interest in the image quality of display device increases, color expression or color reproducibility close to true color is receiving particular attention, and a lot of research has been performed on image quality improvement to improve light uniformity and to realize natural colors.

SUMMARY OF THE INVENTION

An object of the present disclosure is to solve the above and other problems. Another object of the present disclosure is to provide a display device capable of improving image quality.

Another object of the present disclosure is to provide a display device capable of improving luminance and light uniformity of a backlight unit.

Another object of the present disclosure is to provide a display device capable of effectively controlling light provided from a backlight unit.

Another object of the present disclosure is to improve the purity of white light by improving the bluish phenomenon of light provided from a backlight unit.

Another object of the present disclosure is to provide a coupling structure of a display device capable of improving luminance and light uniformity.

Another object of the present disclosure is to provide a display device having a sturdy coupling structure while reducing an optical depth.

In accordance with an aspect of the present disclosure, a display device includes: a display panel; a rear frame which is positioned in a rearward direction of the display panel; an inner frame which is positioned between the display panel and the rear frame, and coupled to the rear frame; and an outer frame which is coupled to the inner frame, and supports a rear surface of the display panel.

BRIEF DESCRIPTION OF THE DRAWINGS

The above and other objects, features and advantages of the present disclosure will be more apparent from the following detailed description in conjunction with the accompanying drawings, in which.

DETAILED DESCRIPTION OF THE PREFERRED EMBODIMENTS

Figure 1:
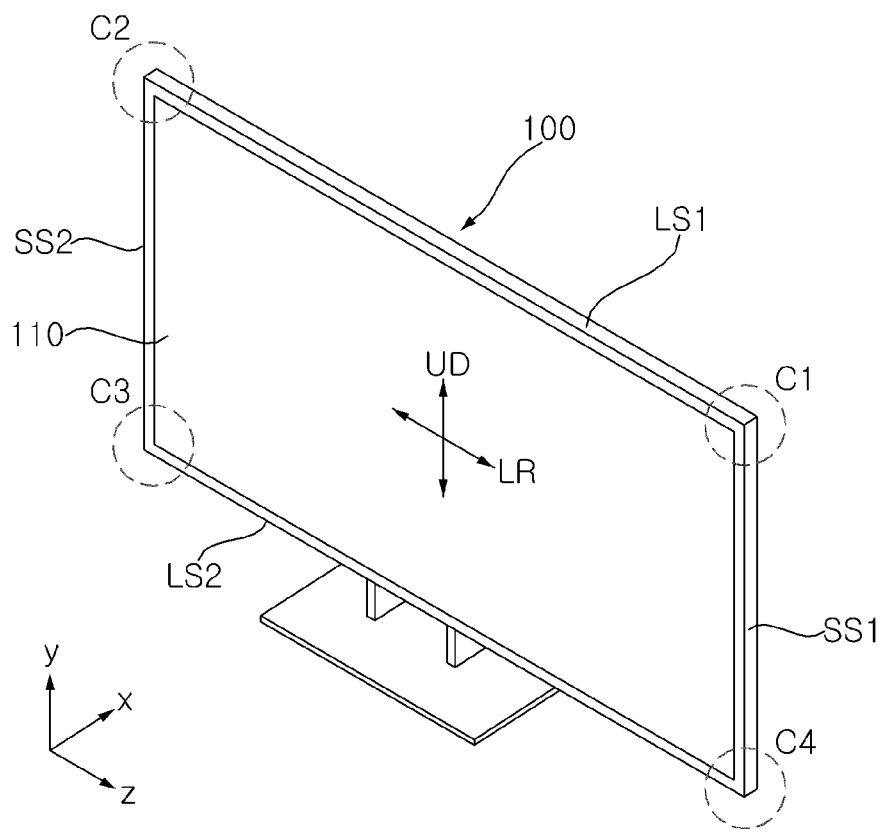
FIGS. 1 to 3 are diagrams illustrating examples of a display device according to embodiments of the present disclosure.
Figure 1:
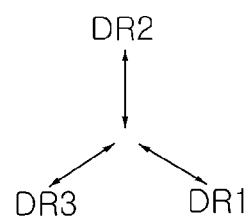

Hereinafter, the embodiments disclosed in the present specification will be described in detail with reference to the accompanying drawings, and the same or similar elements are denoted by the same reference numerals even though they are depicted in different drawings and redundant descriptions thereof will be omitted.

In the following description, with respect to constituent elements used in the following description, the suffixes "module" and "unit" are used or combined with each other only in consideration of ease in the preparation of the specification, and do not have or serve as different meanings.

In addition, in describing the embodiments disclosed in the present specification, if it is determined that detailed descriptions of related known technologies may obscure the gist of the embodiments disclosed in the present specification, the detailed description thereof will be omitted.

In addition, the accompanying drawings are provided only for a better understanding of the embodiments disclosed in the present specification and are not intended to limit the technical ideas disclosed in the present specification. Therefore, it should be understood that the accompanying drawings include all modifications, equivalents and substitutions included in the scope and sprit of the present disclosure.

Hereinafter, a liquid crystal display device (LCD) will be described as an example for a display panel, but the display panel applicable to the present disclosure is not limited to the liquid crystal display device.

Referring to FIG. 1, a display device may include a first long side LS1, a second long side LS2 opposite to the first long side LS1, a first short side SS1 adjacent to the first long side LS1 and the second long side LS2, and a second short side SS2 opposite to the first short side SS1.

The area adjacent to the first short side SS1 may be referred to as a first side area, the area adjacent to the second short side SS2 may be referred to as a second side area opposite to the first side area, the area adjacent to the first long side LS1 may be referred to as a third side area which is adjacent to the first side area and the second side area, and positioned between the first side area and the second side area, and the area adjacent to the second long side LS2 may be referred to as a fourth side area which is adjacent to the first side area and the second side area, positioned between the first side area and the second side area, and opposite to the third side area.

It is illustrated and described that the lengths of the first and second long sides LS1 and LS2 are longer than the lengths of the first and second short sides SS1 and SS2. However, it may be possible that the lengths of the first and second long sides LS1 and LS2 are approximately equal to the lengths of the first and second short sides SS1 and SS2.

A first direction DR1 may be a direction parallel to the long side LS1, LS2 of a display panel 100, and a second direction DR2 may be a direction parallel to the short side SS1, SS2 of the display panel 100. A third direction DR3 may be a direction perpendicular to the first direction DR1 and/or the second direction DR2.

The first direction DR1 and the second direction DR2 may each be referred to as a horizontal direction. In addition, the third direction DR3 may be referred to as a vertical direction.

A side on which the display device displays an image may be referred to as a forward direction or a front side or front surface. When the display device displays an image, the side from which the image cannot be observed may be referred to as a rearward direction, or a rear side or rear surface.

When the display is viewed from the forward direction or the front side, the side of the first long side LS1 may be referred to as an upper side or an upper surface. Similarly, the side of the second long side LS2 may be referred to as a lower side or a lower surface. Similarly, the side of the first short side SS1 may be referred to as a right side or a right surface, and the side of the second short side SS2 may be referred to as a left side or a left surface.

The first long side LS1, the second long side LS2, the first short side SS1, and the second short side SS2 may each be referred to as an edge of the display device. In addition, a point where the first long side LS1, the second long side LS2, the first short side SS1, and the second short side SS2 meet each other may be referred to as a corner. For example, a point where the first long side LS1 and the first short side SS1 meet may be a first corner C1, a point where the first long side LS1 and the second short side SS2 meet may be a second corner C2, a point where the second short side SS2 and the second long side LS2 meet may be a third corner C3, and a point where the second long side LS2 and the first short side SS1 meet may be a fourth corner C4.

A direction from the first short side SS1 to the second short side SS2 or a direction from the second short side SS2 to the first short side SS1 may be referred to as a left-right direction LR. A direction from the first long side LS1 to the second long side LS2 or a direction from the second long side LS2 to the first long side LS1 may be referred to as an up-down direction UD.

Figure 2:
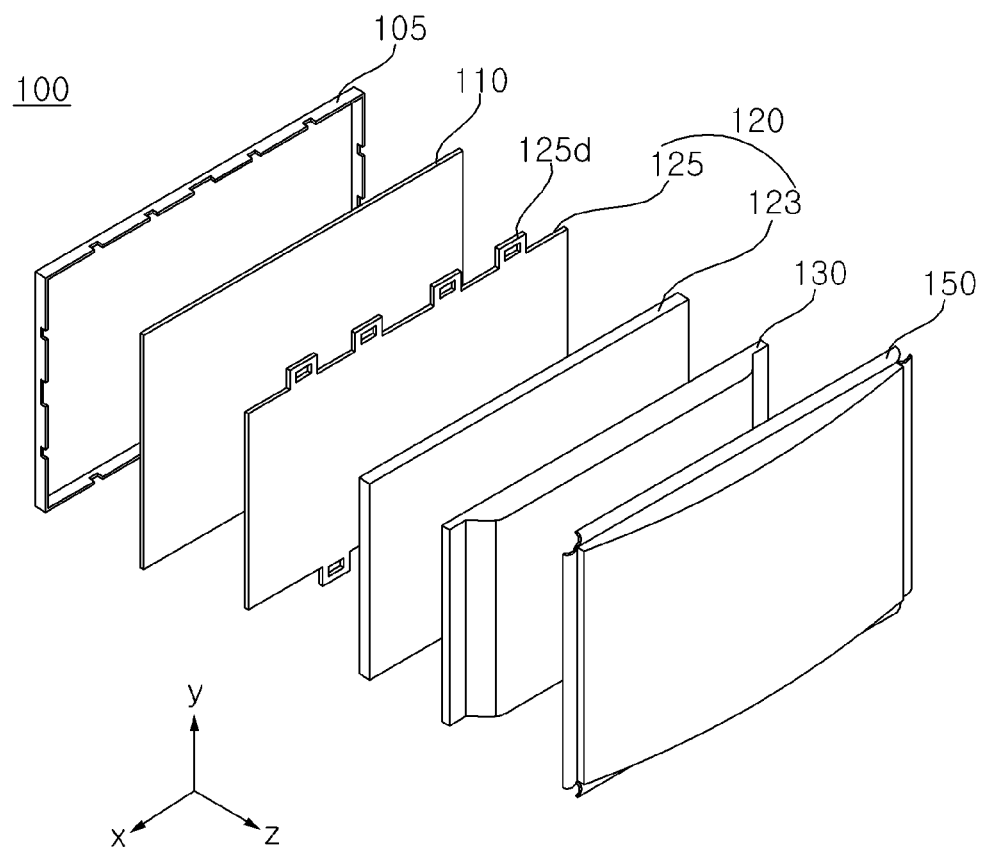

Referring to FIG. 2, a front cover 105 may cover at least partial area of the front and side surfaces of a display panel 110. The front cover 105 may be divided into a front cover positioned in the front surface of the display panel 110 and a side cover positioned in the side surface of the display panel 110. Either one of the front cover and the side cover may be omitted.

The display panel 110 is provided on the front surface of the display device 100 and may display an image. The display panel 110 may display an image in such a manner that a plurality of pixels output red, green, or blue (RGB) for each pixel according to the timing. The display panel 110 may be divided into an active area on which an image is displayed and a de-active area on which an image is not displayed. The display panel 110 may include a front substrate and a rear substrate facing each other with a liquid crystal layer interposed therebetween.

The front substrate may include a plurality of pixels including red (R), green (G), and blue (B) sub-pixels. The front substrate may output light corresponding to a color of red, green, or blue according to a control signal.

The rear substrate may include switching elements. The rear substrate may switch a pixel electrode. For example, the pixel electrode may change the molecular arrangement of the liquid crystal layer according to a control signal applied from an external. The liquid crystal layer may include liquid crystal molecules. The liquid crystal molecules may change their arrangement in response to a voltage difference generated between the pixel electrode and a common electrode. The liquid crystal layer may transmit or block light provided from a backlight unit 120 to the front substrate.

The backlight unit 120 may be positioned toward the rear of the display panel 110. The backlight unit 120 may include light sources. The backlight unit 120 may be coupled to a frame 130 toward a front of the frame 130. The frame 130 may be referred to as a rear frame 130 or a main frame 130.

The backlight unit 120 may be driven by a full driving method or a partial driving method such as local dimming or impulsive. The backlight unit 120 may include an optical sheet 125 and an optical layer 123. The optical layer 123 may be referred to as an optical module 123 or an optical unit 123.

The optical sheet 125 may allow the light of the light source to be evenly transmitted to the display panel 110. The optical sheet 125 may include a plurality of layers. For example, the optical sheet 125 may include a prism sheet, a diffusion sheet, or the like.

The optical sheet 125 may include a coupling portion 125d. The coupling portion 125d may be coupled to the front cover 105, the frame 130, and/or a back cover 150. Alternatively, the coupling portion 125d may be fastened to a structure formed or coupled on the front cover 105, the frame 130, and/or the back cover 150.

The frame 130 may serve to support components of the display device 100. For example, a configuration such as the backlight unit 120 may be coupled to the frame 130. The frame 130 may be made of a metal material such as an aluminum alloy.

The back cover 150 may be positioned at the rear side or toward the rearward direction of the display device 100. The back cover 150 may be coupled to the frame 130 and/or the front cover 105. For example, the back cover 150 may be an injection made of a resin material.

Figure 3:
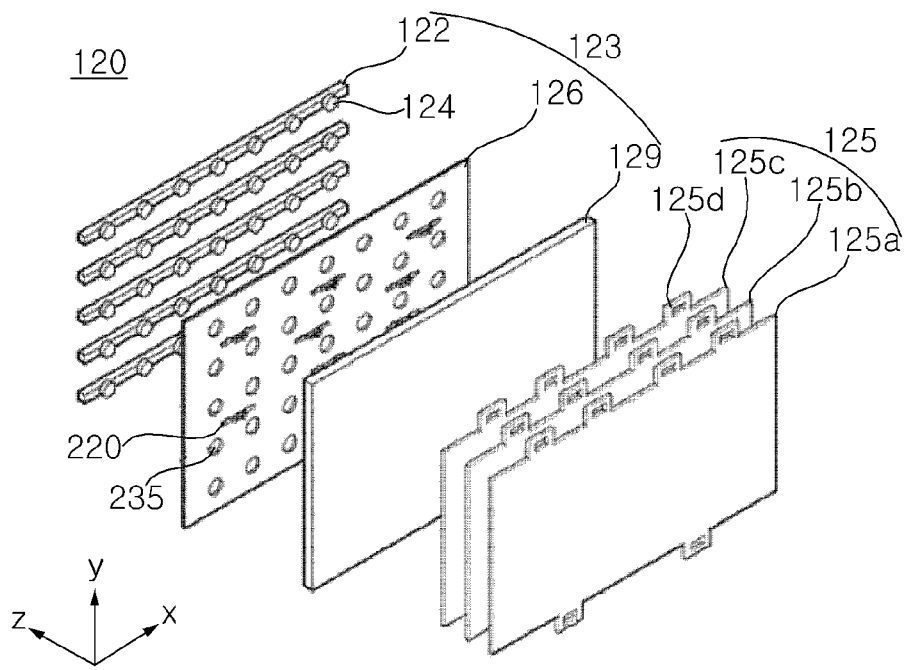

Referring to FIG. 3, the substrate 122 may be configured in the form of a plurality of straps which extend in a first direction and are spaced apart from each other by a certain distance in a second direction orthogonal to the first direction.

At least one optical assembly 124 may be mounted on the substrate 122. An electrode pattern for connecting an adapter and the optical assembly 124 may be formed on the substrate 122. For example, a carbon nanotube electrode pattern for connecting the optical assembly 124 and the adapter may be formed on the substrate 122.

The substrate 122 may be formed of at least one of polyethylene terephthalate (PET), glass, polycarbonate (PC), and silicon. The substrate 122 may be a printed circuit board (PCB) on which at least one optical assembly 124 is mounted.

The optical assembly 124 may be disposed on the substrate 122 with a certain interval in the first direction. A diameter of the optical assembly 124 may be greater than a width of the substrate 122. In other words, the diameter may be greater than the thickness of the substrate 122 in the second direction.

The optical assembly 124 may be a light emitting diode (LED) chip or a light emitting diode package including at least one light emitting diode chip.

The optical assembly 124 may include a light source. The light source may be a colored LED or a white LED that emits at least one color among colors such as red, blue, green, and the like. The colored LED may be a blue LED. For example, the light source may be a mini LED.

A reflective sheet 126 may be positioned at the front side of the substrate 122. The reflective sheet 126 may be positioned on an area of the substrate 122 excluding the area where the optical assembly 124 is formed. The reflective sheet 126 may have a plurality of holes 235.

The reflective sheet 126 may reflect the light emitted from the optical assembly 124 toward the front side. In addition, the reflective sheet 126 may re-reflect light emitted from the optical assembly 124.

The reflective sheet 126 may include at least one of metal and metal oxide which are reflective materials. For example, the reflective sheet 126 may include a metal having a high reflectance such as at least one of aluminum (Al), silver (Ag), gold (Au), and titanium dioxide (TiO2) and/or a metal oxide.

A resin may be deposited or coated on the optical assembly 124 and/or the reflective sheet 126. The resin may serve to diffuse light emitted from the optical assembly 124.

An optical layer 129 may include a phosphor. The optical layer 129 may be formed of a plate or a thin sheet. The optical layer 129 may include a red-based phosphor and/or a green-based phosphor. The optical layer 129 may change a wavelength or color of light provided from the optical assembly 124. For example, when the optical assembly 124 provides blue-based light, the optical layer 129 may convert the blue-based light to white light. The optical layer 129 may be referred to as a QD layer or a QD sheet.

The optical sheet 125 may be positioned in the forward direction of the optical layer 129. The rear surface of the optical sheet 125 may be in close contact with the optical layer 129, and the front surface of the optical sheet 125 may be in close contact with or adjacent to the rear surface of the display panel 110.

The optical sheet 125 may include at least one sheet. In some cases, the optical sheet 125 may include one or more prism sheets and/or one or more diffusion sheets. The plurality of sheets included in the optical sheet 125 may be in an adhesive state and/or a close contact state.

The optical sheet 125 may be configured of a plurality of sheets having different functions. For example, the optical sheet 125 may include first to third optical sheets 125a to 125c. For example, the first optical sheet 125a may be a diffusion sheet, and the second and third optical sheets 125b and 125c may be a prism sheet. The number and/or positions of the diffusion sheet 125a and the prism sheets 125b and 125c may be changed.

The diffusion sheet 125a may prevent the light emitted from the optical layer 129 from being partially concentrated, thereby making light distribution more uniform. The prism sheets 125b and 125c may collect light emitted from the diffusion sheet 125a to provide light to the display panel 110.

The coupling portion 125d may be formed in at least one of sides or edges of the optical sheet 125. The coupling portion 125d may be formed in at least one of the first to third optical sheets 125a to 125c.

The coupling portion 125d may be formed in the long side of the optical sheet 125. The coupling portion 125d formed in the first long side and the coupling portion 125d formed in the second long side may be asymmetric. For example, the positions and/or the number of the coupling portion 125d in the first long side and the coupling portion 125d in the second long side may be different from each other.

Figure 4:
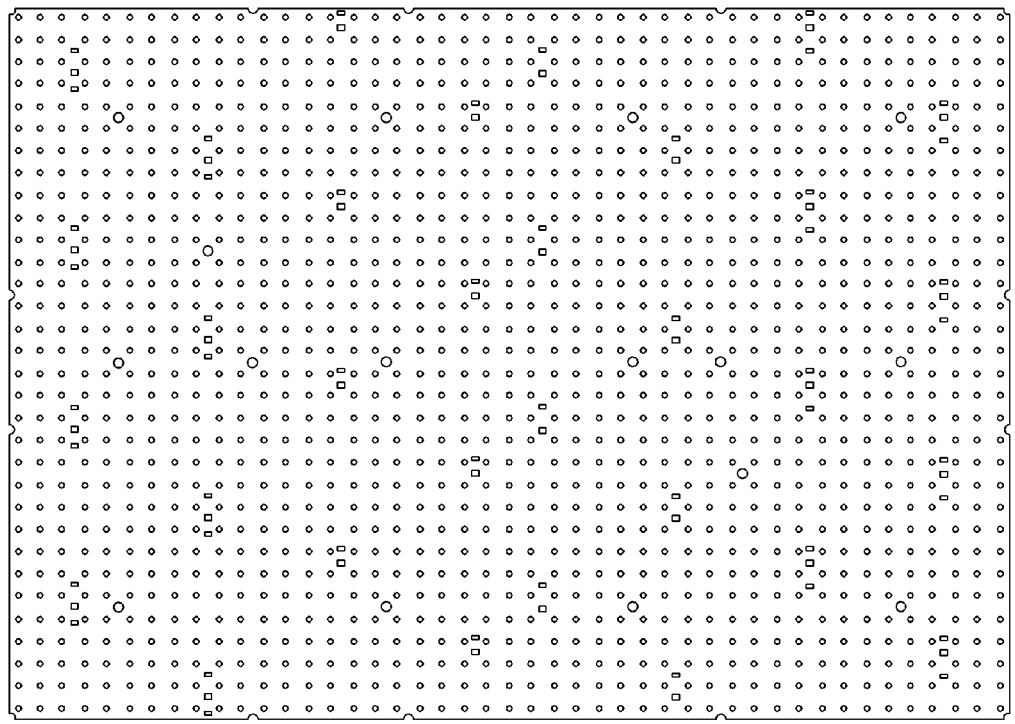
FIGS. 4 to 6 are diagrams illustrating examples of a substrate and a optical assembly for providing light to a display device according to embodiments of the present disclosure.
Figure 5:
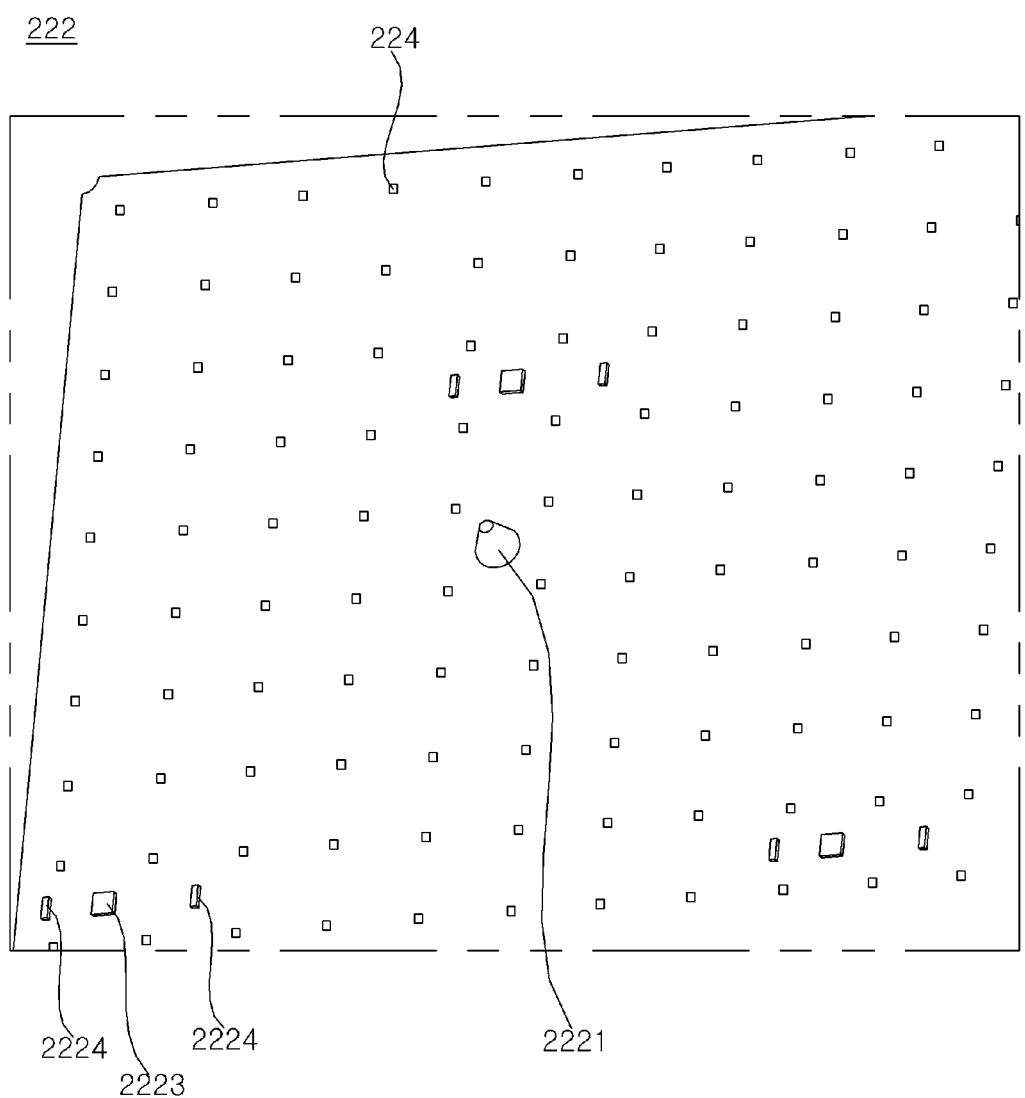

Referring to FIGS. 4 and 5, a substrate 222 may be a plate. The front surface of the substrate 222 may be white. A white or reflective material may be applied to the front surface of the substrate 222. The optical assembly 224 may be mounted on the substrate 222. The optical assembly 224 may include a light source and a mini-lens. For example, the light source may be a mini LED that provides blue-based light. A plurality of light sources may be mounted on the substrate 222. The plurality of light sources may be disposed to form a plurality of rows and a plurality of columns.

An integrated device 2223 and a capacitor 2224 may be disposed around the light source 224. For example, the integrated device 2223 may be an IC chip 2223. The plurality of capacitors 2224 may face the integrated device 2223. The integrated device 2223 may control power provided to a certain number of the plurality of light sources 224.

A supporter 2221 may be mounted on the substrate 222. The supporter 2221 may maintain a constant distance between the substrate 222 and the aforementioned optical layer 129. The supporter 2221 may have a conical shape as a whole. The supporter 2221 may be formed by double injection and may be bonded to the substrate 222. The supporter 2221 may be positioned between the optical assemblies 224, and may be fixed on the substrate 222.

Figure 6:
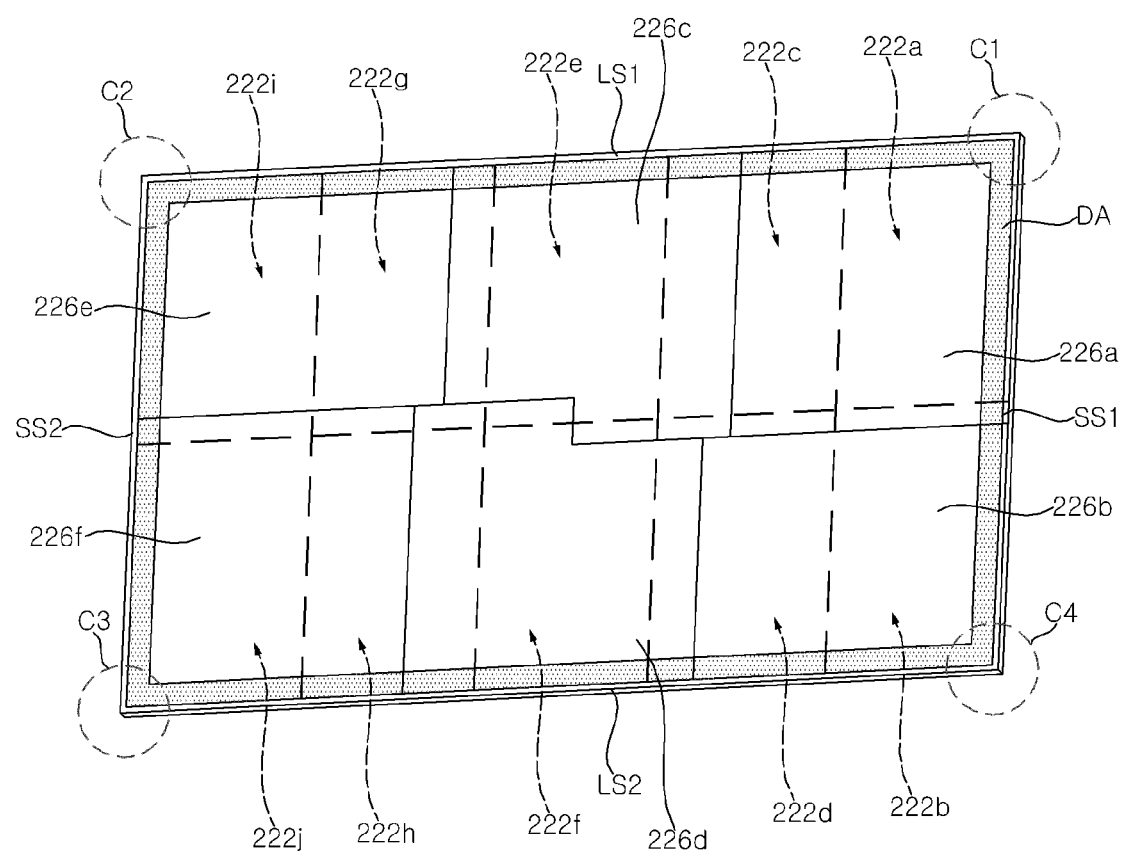

Referring to FIG. 6, there may be a plurality of substrates 222. The plurality of substrates 222 may include a first substrate 222a, a second substrate 222b, a third substrate 222c, a fourth substrate 222d, a fifth substrate 222e, a sixth substrate 222f, a seventh substrate 222g, an eighth substrate 222h, a ninth substrate 222i, and a tenth substrate 222j.

The first substrate 222a may be positioned in contact with the first long side LS1 and the first short side SS1, and may form a first corner C1. The second substrate 222b may be positioned in contact with the first short side SS1 and the second long side LS2, and may form a fourth corner C4. The second substrate 222b may be adjacent to the first substrate 222a in the up-down direction.

The ninth substrate 222i may be positioned in contact with the first long side LS1 and the second short side SS2, and may form a second corner C2. The tenth substrate 222j may be positioned in contact with the second short side SS2 and the second long side LS2, and may form a third corner C3. The tenth substrate 222j may be adjacent to the ninth substrate 222i in the up-down direction.

The fifth substrate 222e may be in contact with the first long side LS1 and may be positioned between the first substrate 222a and the ninth substrate 222i. The sixth substrate 222f may be in contact with the second long side LS2 and may be positioned between the second substrate 222d and the tenth substrate 222j. The sixth substrate 222f may be adjacent to the fifth substrate 222e in the up-down direction.

The third substrate 222c may be in contact with the first long side LS1 and may be positioned between the first substrate 222a and the fifth substrate 222e. The fourth substrate 222d may be in contact with the second long side LS2 and may be positioned between the second substrate 222*b* and the sixth substrate 222*f*. The fourth substrate 222*d* may be adjacent to the third substrate 222*c* in the up-down direction.

The seventh substrate 222*g* may be in contact with the first long side LS1 and may be positioned between the fifth substrate 222*e* and the ninth substrate 222*i*. The eighth substrate 222*h* may be in contact with the second long side LS2 and may be positioned between the sixth substrate 222*f* and the tenth substrate 222*j*. The eighth substrate 222*h* may be adjacent to the seventh substrate 222*g* in the up-down direction.

The reflective sheet 226 may cover the substrate 222. There may be a plurality of reflective sheets 226. The plurality of reflective sheets 226 may cover the plurality of substrates 222. The plurality of reflective sheets 226 may include a first reflective sheet 226*a*, a second reflective sheet 226*b*, a third reflective sheet 226*c*, a fourth reflective sheet 226*d*, a fifth reflective sheet 226*e*, and a sixth reflective sheet 226*f*.

The first reflective sheet 226*a* may cover the first substrate 222*a*. The first reflective sheet 226*a* may overlap the second substrate 222*b*, the third substrate 222*c*, and the fourth substrate 222*d*. The second reflective sheet 226*b* may cover at least a part or most of the second substrate 222*b*, and may overlap the fourth substrate 222*d*.

The third reflective sheet 226*c* may cover at least a part or most of the fifth substrate 222*e*. The third reflective sheet 226*c* may overlap the third substrate 222*c*, the fourth substrate 222*d*, the sixth substrate 222*f*, and the seventh substrate 222*g*. The fourth reflective sheet 226*d* may cover at least a part or most of the sixth substrate 222*f*. The fourth reflective sheet 226*d* may overlap the fourth substrate 222*d*, the fifth substrate 222*e*, the sixth substrate 222*f*, and the seventh substrate 222*g*.

The fifth reflective sheet 226*e* may cover at least a part or most of the ninth substrate 222*i*, and may overlap the seventh substrate 222*g*. The sixth reflective sheet 226*f* may cover the tenth substrate 222*j*. The sixth reflective sheet 226*f* may overlap the seventh substrate 222*g*, the eighth substrate 222*h*, and the ninth substrate 222*i*.

An area DA or a dot area DA or a pattern area DA may be formed along the first long side LS1, the second long side LS2, the first short side SS1, and/or the second short side SS2.

Figure 7:
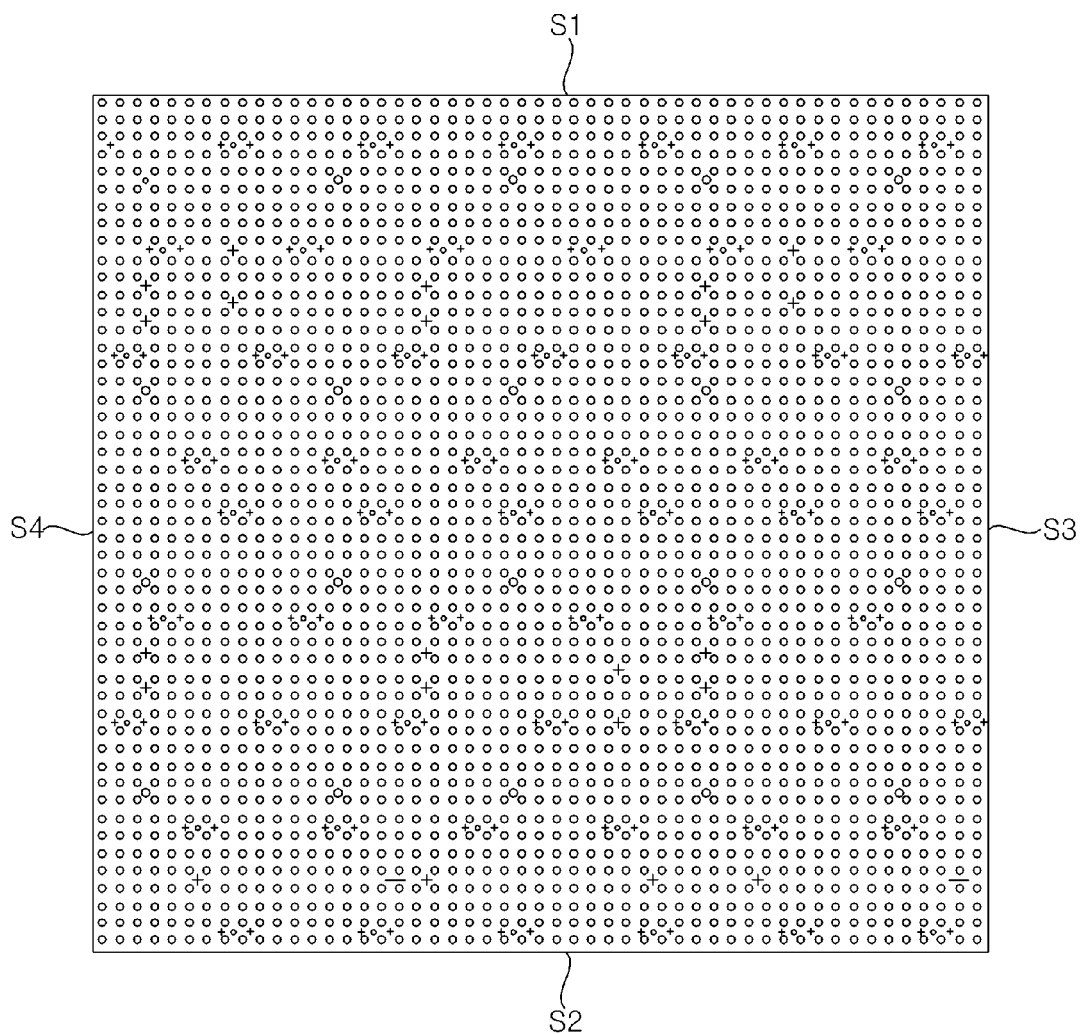
FIGS. 7 to 16 are diagrams illustrating examples of a reflective sheet according to embodiments of the present disclosure.
Figure 8:
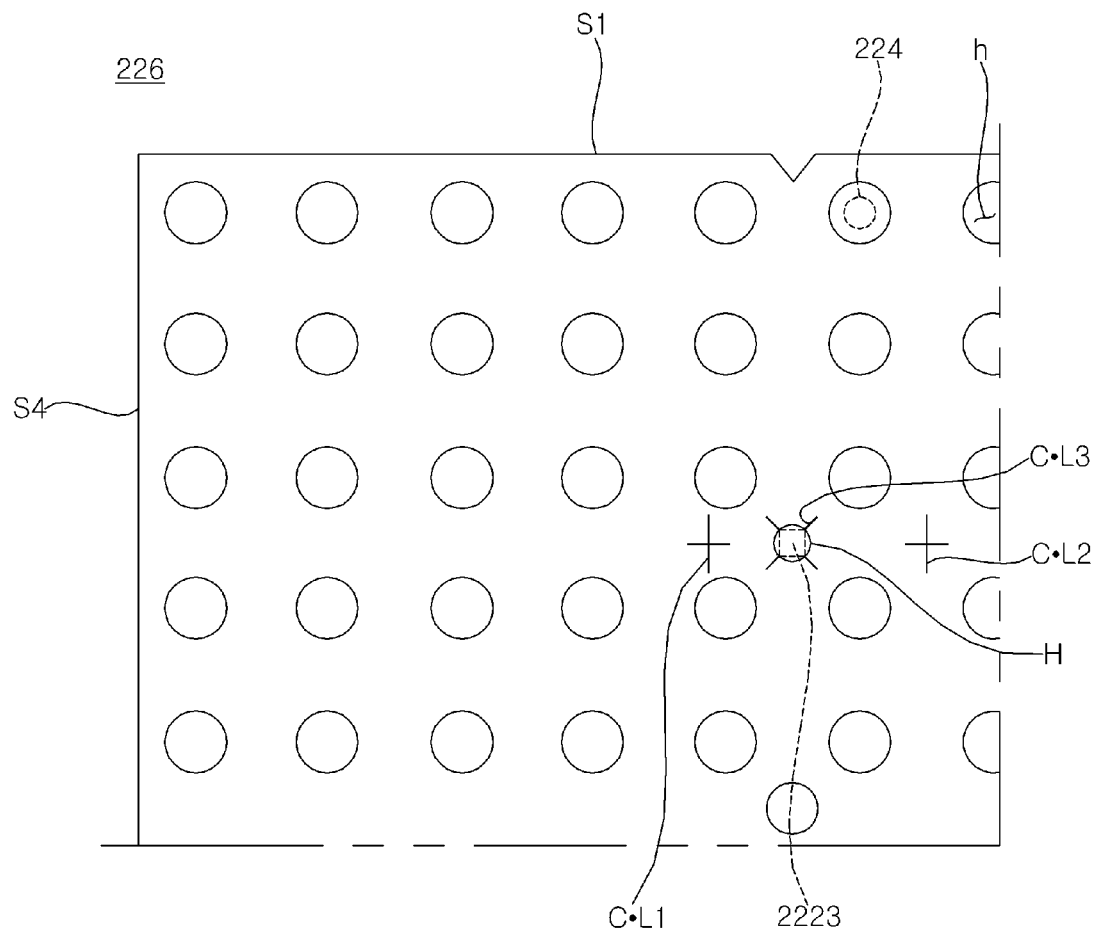

Referring to FIGS. 7 and 8, the reflective sheet 226 may include a first side S1, a second side S2, a third side S3, and a fourth side S4. A side S may be referred to as an edge S.

The reflective sheet 226 may include a plurality of holes (h) and a plurality of cut-lines (CL). The plurality of holes h may be formed to correspond to the light sources 224 or the optical assemblies 224. An area of the hole h may be greater than an area of the optical assembly 224.

The reflective sheet 226 may have an accommodation hole H. A cut-line CL3 may be formed around the accommodation hole H. The cut line CL3 may be formed in the radial direction of the accommodation hole H. For example, the cut line CL3 may have a + or cross shape. The accommodation hole H may be referred to as a cut-line hole H. The integrated device 2223 may be positioned in the accommodation hole H. The area of the accommodation hole H may be larger than the area of the integrated device 2223. For example, the accommodation hole H may have a circular shape, and the integrated device 2223 may have a rectangular shape. A portion of the integrated device 2223 may slightly overlap or overhang the accommodation hole H, and thus the cut line CL3 around the accommodation hole H may be forced open to accommodate.

The reflective sheet 226 may include a cut line CL. For example, the cut line CL may have a + or cross shape. The cut line CL1, CL2 may be positioned between the holes h, and may be positioned adjacent to the accommodation hole H. A first cut line CL1 may be positioned between the holes h, and may be positioned adjacent to the accommodation hole H. A second cut line CL2 may be positioned opposite the first cut line CL1 with respect to the accommodation hole H. The accommodation hole H may be positioned between the first cut line CL1 and the second cut line CL2. The capacitors 2224 (see FIG. 5) adjacent to the integrated device 2223 may be positioned to correspond to the cut lines CL1 and CL2, and the cut lines CL1 and CL2 may be opened to accommodate.

Accordingly, it is possible to prevent the reflective sheet 226 from being spaced apart from the substrate 222, and to improve light uniformity.

Figure 9:
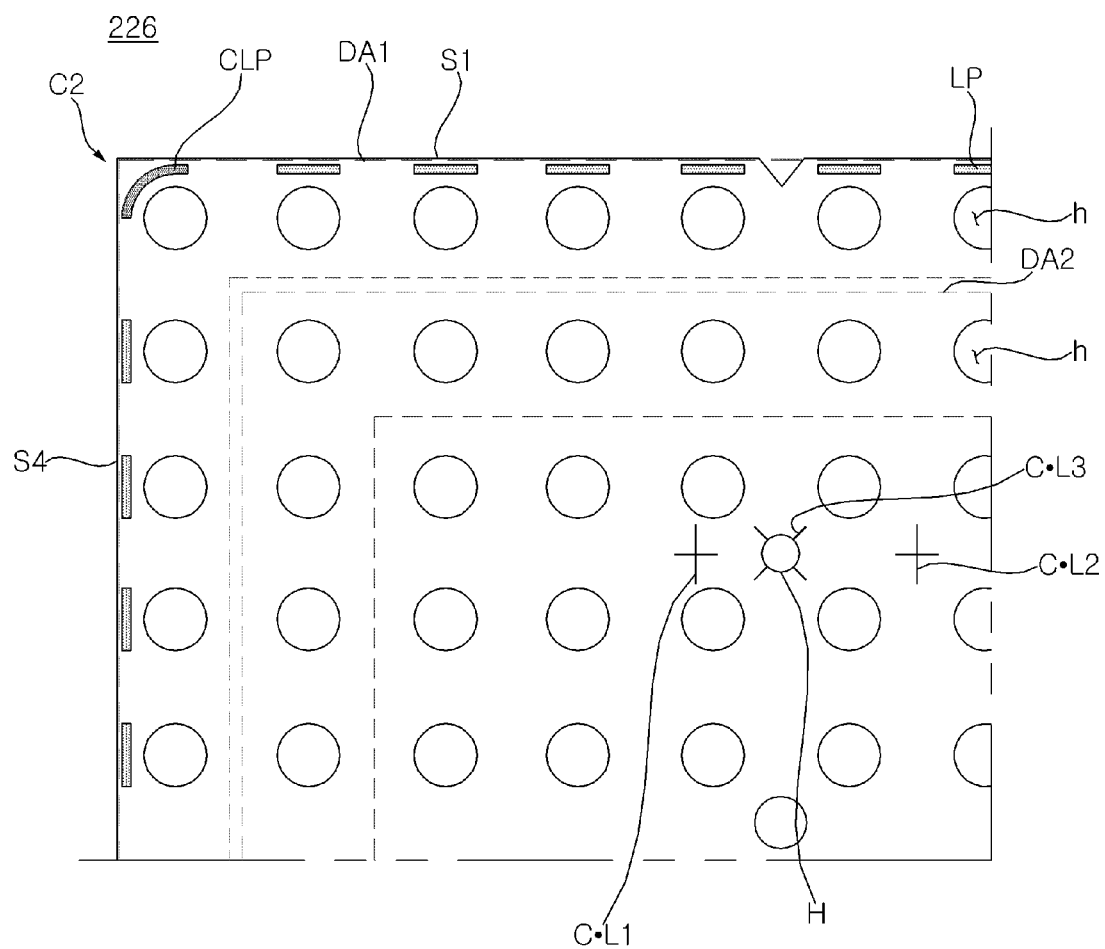

Referring to FIG. 9, the reflective sheet 226 may include a first area DA1 and a second area DA2. The first area DA1 may be referred to as a first dot area DA1 or a first pattern area DA1, and the second area DA2 may be referred to as a second dot area DA2 or a second pattern area DA2.

The first area DA1 may be formed to be elongated along the first side S1 and/or the fourth side S4. The first plurality of holes h may be sequentially formed in the first area DA1 while maintaining a constant interval. The first area DA1 may be in contact with the first side S1 and/or the fourth side S4. The description of the first side S1 and/or the fourth side S4 may be applied to other sides S2 and S3.

The second area DA2 may be formed to be elongated along the first side S1 and/or the fourth side S4. The second plurality of holes h may be sequentially formed in the second area DA2 while maintaining a constant interval. The second area DA2 may be in contact with or adjacent to the first area DA1. The distance of the second area DA2 from the first side S1 and/or the second side S2 is greater than the distance of the first area DA1 from the first side S1 and/or the fourth side S4. The first area DA1 may be positioned between the second area DA2 and the first side S1 and/or the fourth side S4.

The light pattern LP, CLP may include a phosphor. The light pattern LP, CLP may include a red-based phosphor and a green-based phosphor. The light pattern LP, CLP may include a yellow-based phosphor.

For example, the light pattern LP, CLP may have a yellow-based color, with the naked eye. The light pattern LP, CLP may convert blue-based light provided by the light source 224 (refer to FIG. 5) or the optical assembly 224 into white light.

For another example, the light pattern LP, CLP may have black or gray-based color, with the naked eye. The light pattern LP, CLP may absorb light provided by the light source 224 (refer to FIG. 5) or the optical assembly 224.

The light pattern LP, CLP may be formed in the first area DA1. The light pattern LP, CLP may be formed between the plurality of first holes h and the first side S1 and/or the fourth side S4. The light pattern LP, CLP may include a plurality of segments LP and CLP. The plurality of segments LP may be an elongated line. Each of the plurality of lines LP may be positioned to correspond to each of the plurality of holes h. For example, the length of the line LP may correspond to the diameter of the hole h. As another example, the length of the line LP may be smaller than the diameter of the hole h. As another example, the length of the line LP may be greater than the diameter of the hole h.

The corner line CLP may extend while being bent or curved or may have a fan shape or semicircular shape. For example, the corner line CLP may be a quarter circle. The corner line CLP may be positioned between the hole h closest to the second corner C2 and the second corner C2. The description of the second corner C2 may be applied to other corners C1, C3, C4.

Figure 10:
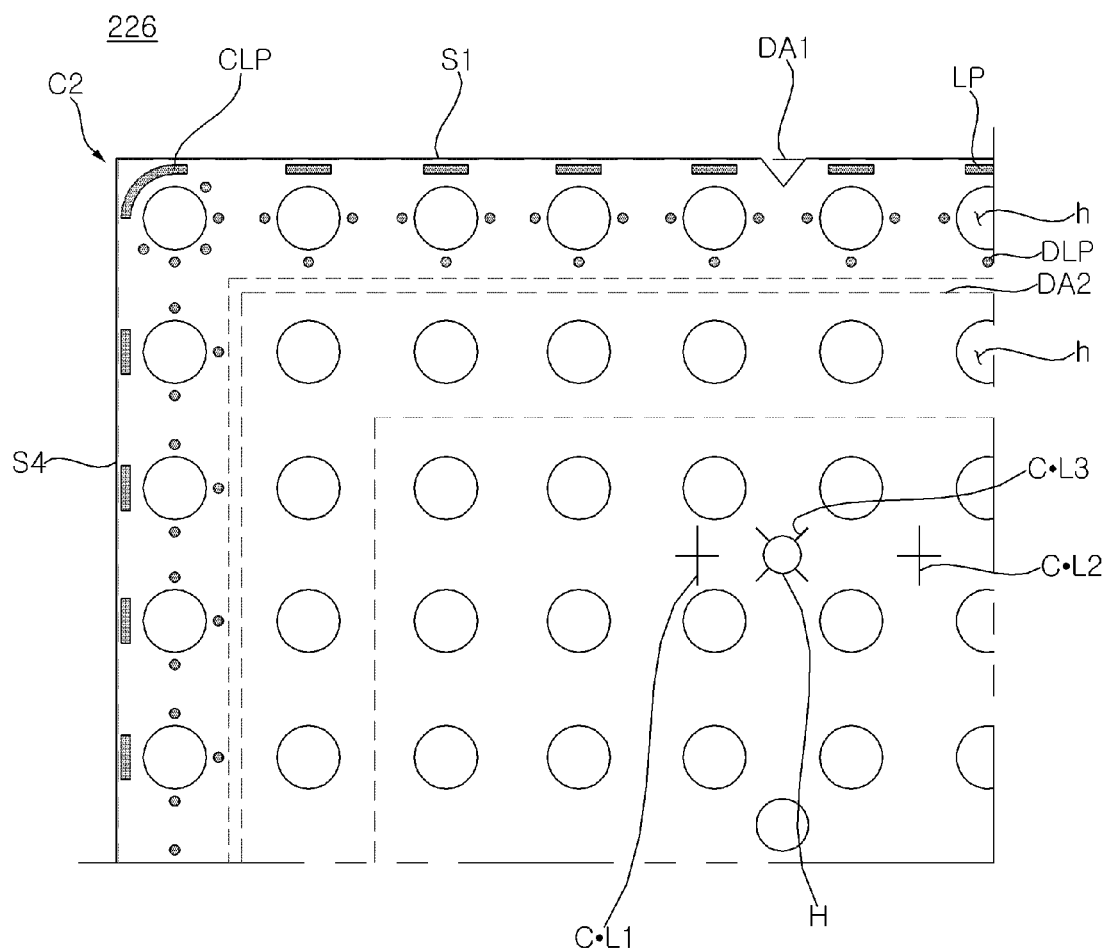

Referring to FIG. 10, the reflective sheet 226 may include a first area DA1 and a second area DA2. The first area DA1 may be referred to as a first dot area DA1 or a first pattern area DA1, and the second area DA2 may be referred to as a second dot area DA2 or a second pattern area DA2.

The first area DA1 may be formed to be elongated along the first side S1 and/or the fourth side S4. A first plurality of holes h may be sequentially formed in the first area DA1 while maintaining a constant interval. The first area DA1 may be in contact with the first side S1 and/or the fourth side S4. The description of the first side S1 and/or the fourth side S4 may be applied to other sides S2 and S3.

The second area DA2 may be formed to be elongated along the first side S1 and/or the fourth side S4. A second plurality of holes h may be sequentially formed in the second area DA2 while maintaining a constant interval. The second area DA2 may be in contact with or adjacent to the first area DA1. The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The light pattern LP, CLP, DLP may include a phosphor. The light pattern LP, CLP, DLP may include a red-based phosphor and a green-based phosphor. The light pattern LP, CLP, DLP may include a yellow-based phosphor.

For example, with the naked eye, the light pattern LP, CLP, DLP may have a yellow-based color. The light pattern LP, CLP, DLP may convert blue-based light provided by the light source 224 (refer to FIG. 5) or the optical assembly 224 to white light.

For another example, the light pattern LP, CLP, DLP may have black or gray-based color, with the naked eye. The light pattern LP, CLP, DLP may absorb light provided by the light source 224 (refer to FIG. 5) or the optical assembly 224.

The light pattern LP, CLP, DLP may be formed in the first area DA1. The light pattern LP, CLP may be formed between the first plurality of holes h and the first side S1 and/or the fourth side S4.

The light pattern LP may include a plurality of segments LP. The plurality of segments LP may be an elongated line. Each of the plurality of lines LP may be positioned to correspond to each of the plurality of holes h. For example, the length of the line LP may correspond to the diameter of the hole h. As another example, the length of the line LP may be smaller than the diameter of the hole h. As another example, the length of the line LP may be greater than the diameter of the hole h.

The light pattern DLP may include dots DLP. The dots DLP may be disposed around the hole h. For example, the number of dots DLP may be three, or any other variation of numbers. The line LP and the dot DLP may be disposed to surround the hole h. Two dots DLP may be positioned opposite each other with respect to the hole h, and one dot DLP may be positioned opposite the line LP with respect to the hole h.

The light pattern CLP may include a corner line CLP. The corner line CLP may extend while being bent or curved or may have a fan shape or semicircular shape. For example, the corner line CLP may be a quarter circle. The corner line CLP may be positioned between the hole h closest to the second corner C2 and the second corner C2. The corner line CLP may be referred to as a curved line CLP. The dots DLP may be disposed around the hole h closest to the second corner C2. For example, the number of dots DLP may be five, or any other variation of numbers. The five dots DLP may be sequentially disposed around the hole h closest to the second corner C2 together with the corner line CLP. The dots DLP may be opposite to the corner line CLP with respect to the hole h. The description of the second corner C2 may be applied to other corners C1, C3, and C4.

Figure 11:
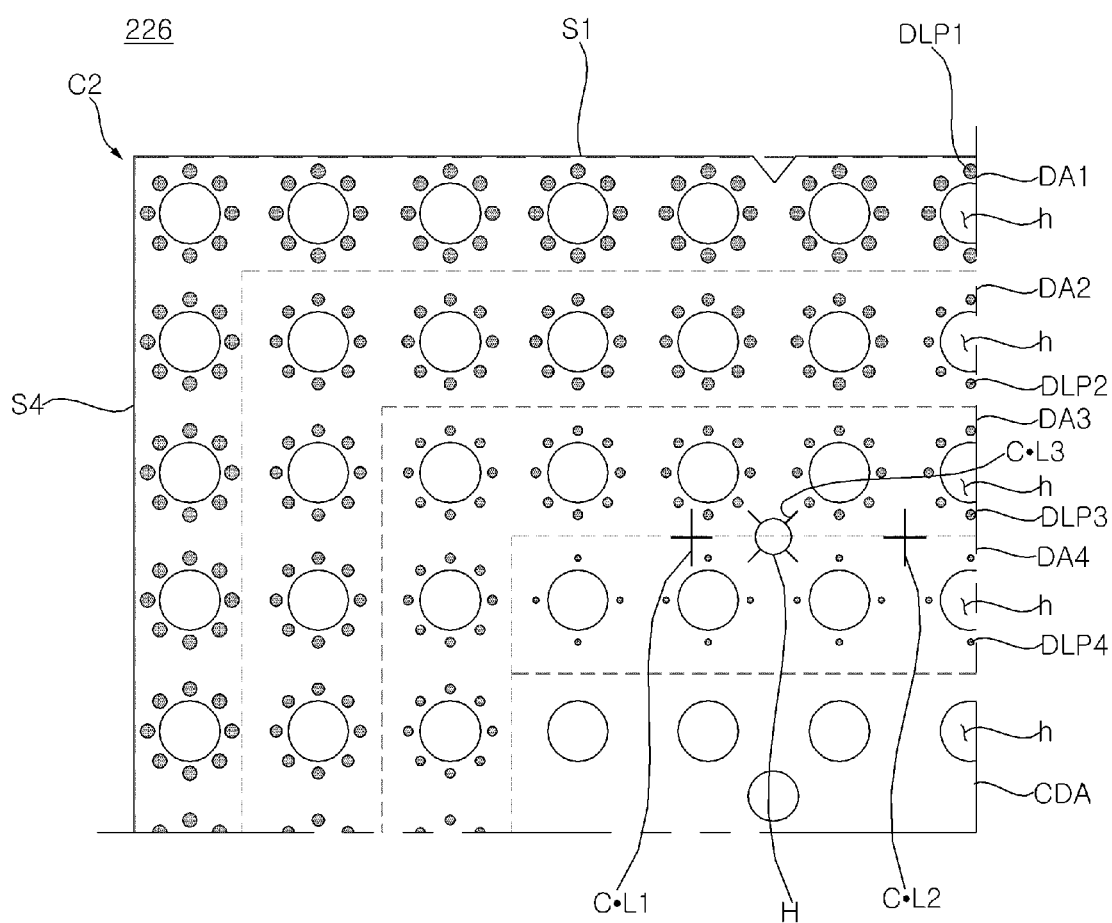

Referring to FIG. 11, the reflective sheet 226 may include a first area DA1, a second area DA2, a third area DA3, a fourth area DA4, and a central area CDA. The area DA may be referred to as a dot area DA.

The first area DA1 may be formed to be elongated along the first side S1 and/or the fourth side S4. The first plurality of holes h may be sequentially formed in the first area DA1 while maintaining a constant interval. The first area DA1 may be in contact with the first side S1 and/or the fourth side S4. The description of the first side S1 and/or the fourth side S4 may be applied to other sides S2 and S3.

The second area DA2 may be formed to be elongated along the first side S1 and/or the fourth side S4. The second plurality of holes h may be sequentially formed in the second area DA2 while maintaining a constant interval. The second area DA2 may be in contact with or adjacent to the first area DA1. The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The third area DA3 may be formed to be elongated along the first side S1 and/or the fourth side S4. A third plurality of holes h may be sequentially formed in the third area DA3 while maintaining a constant interval. The third area DA3 may be in contact with or adjacent to the second area DA2. The distance of the third area DA3 from the first side S1 and/or the fourth side S4 may be greater than the distance of the second area DA2 from the first side S1 and/or the fourth side S4. The second area DA2 may be positioned between the third area DA3 and the first area DA1.

The fourth area DA4 may be formed to be elongated along the first side S1. A fourth plurality of holes h may be sequentially formed in the fourth area DA4 while maintaining a constant interval. The fourth area DA4 may be in contact with or adjacent to the third area DA3. The distance of the fourth area DA4 from the first side S1 and/or the fourth side S4 may be greater than the distance of the third area DA3 from the first side S1 and/or the fourth side S4. The third area DA3 may be positioned between the fourth area DA4 and the second area DA2.

The central area CDA may be an area of the reflective sheet 226 excluding the first area DA1, the second area DA2, the third area DA3, and the fourth area DA4.

The light pattern DLP may include a phosphor. The light pattern DLP may include a red-based phosphor and a green-based phosphor. The light pattern DLP may include a yellow-based phosphor.

For example, the light pattern DLP may have a yellow-based color, with the naked eye. The light pattern DLP may convert blue-based light provided by the light source 224 (refer to FIG. 5) or the optical assembly 224 into white light.

As another example, the light pattern DLP may have black or gray-based color, with the naked eye. The light pattern DLP may absorb light provided by the light source 224 (refer to FIG. 5) or the optical assembly 224.

The light pattern DLP may include dots DLP. The dots DLP may be disposed around the hole h. The dots DLP may be disposed to surround the hole h.

First dots DLP1 may be disposed around at least one of the first plurality of holes h. For example, the number of the first dots DLP1 may be eight, or any other variation of numbers, and the eight first dots DLP1 may be sequentially positioned around the hole h while maintaining a constant interval.

Second dots DLP2 may be disposed around at least one of the second plurality of holes h. For example, the number of second dots DLP2 may be eight, and the eight second dots DLP2 may be sequentially positioned around the hole h while maintaining a constant interval.

Third dots DLP3 may be disposed around at least one of the plurality of third holes h. For example, the number of third dots DLP3 may be eight, or any other variation of numbers, and the eight third dots DLP3 may be sequentially positioned around the hole h while maintaining a constant interval.

Fourth dots DLP4 may be disposed around at least one of the plurality of fourth holes h. For example, the number of fourth dots DLP4 may be three or four, or any other variation of numbers, and four fourth dots DLP4 may be sequentially positioned around the hole h while maintaining a constant interval. The number of dots DLP4 around the hole h adjacent to the cut line CL1 may be three. The dot DLP4 may be excluded from an area adjacent to the cut line CL1 around the hole h.

The sizes of dots may vary based on location. For example, the size of the first dot DLP1 may be greater than the size of the second dot DLP2. The size of the second dot DLP2 may be greater than the size of the third dot DLP3. The size of the third dot DLP3 may be greater than the size of the fourth dot DLP4. As another example, the sizes of the first dot DLP1, the second dot DLP2, the third dot DLP3, and the fourth dot DLP4 may have the same size. When the sizes of the dots DLP are the same, the number of dots DLP may increase.

The description of the second corner C2 may be applied to other corners C1, C3, and C4.

Figure 12:
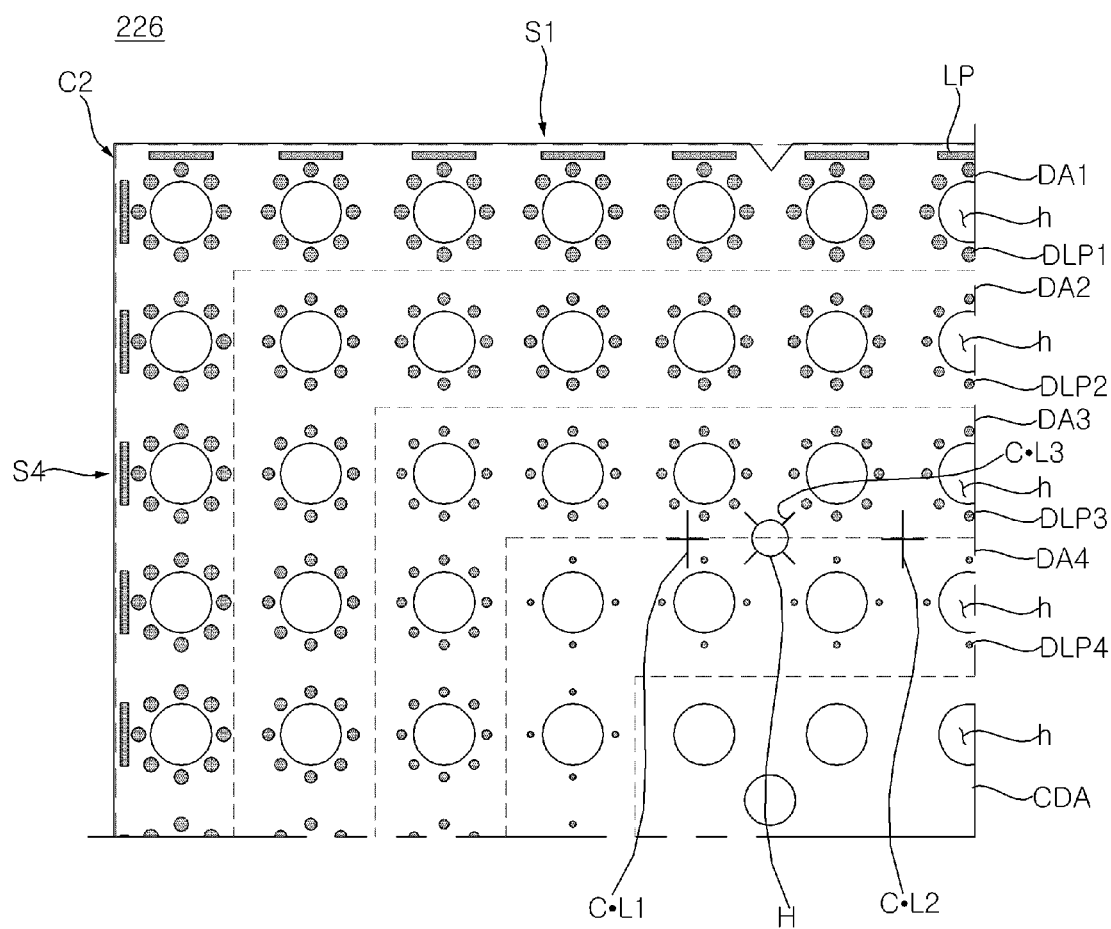

Referring to FIG. 12, the reflective sheet 226 may include a first area DA1, a second area DA2, a third area DA3, a fourth area DA4, and a central area CDA. The area DA may be referred to as a dot area DA or a pattern area DA.

The first area DA1 may be formed to be elongated along the first side S1 and/or the fourth side S4. The first plurality of holes h may be sequentially formed in the first area DA1 while maintaining a constant interval. The first area DA1 may be in contact with the first side S1 and/or the fourth side S4. The description of the first side S1 and/or the fourth side S4 may be applied to other sides S2 and S3.

The second area DA2 may be formed to be elongated along the first side S1 and/or the fourth side S4. The second plurality of holes h may be sequentially formed in the second area DA2 while maintaining a constant interval. The second area DA2 may be in contact with or adjacent to the first area DA1. The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The third area DA3 may be formed to be elongated along the first side S1 and/or the fourth side S4. A third plurality of holes h may be sequentially formed in the third area DA3 while maintaining a constant interval. The third area DA3 may be in contact with or adjacent to the second area DA2. The distance of the third area DA3 from the first side S1 and/or the fourth side S4 may be greater than the distance of the second area DA2 from the first side S1 and/or the fourth side S4. The second area DA2 may be positioned between the third area DA3 and the first area DA1.

The fourth area DA4 may be formed to be elongated along the first side S1 and/or the fourth side S4. A fourth plurality of holes h may be sequentially formed in the fourth area DA4 while maintaining a constant interval. The fourth area DA4 may be in contact with or adjacent to the third area DA3. The distance of the fourth area DA4 from the first side S1 and/or the fourth side S4 may be greater than the distance of the third area DA3 from the first side S1 and/or the fourth side S4. The third area DA3 may be positioned between the fourth area DA4 and the second area DA2.

The central area CDA may be an area of the reflective sheet 226 excluding the first area DA1, the second area DA2, the third area DA3, and the fourth area DA4.

The light pattern DLP, LP may include a phosphor. The light pattern DLP, LP may include a red-based phosphor and a green-based phosphor. The light pattern DLP, LP may include a yellow-based phosphor.

For example, the light pattern DLP, LP may have a yellow-based color, with the naked eye. The light pattern DLP, LP may convert blue-based light provided by the light source 224 (refer to FIG. 5) or the optical assembly 224 into white light.

As another example, the light pattern DLP, LP may have black or gray-based color, with the naked eye. The light pattern DLP, LP may absorb light provided by the light source 224 (refer to FIG. 5) or the optical assembly 224.

The light pattern DLP may include dots DLP. The dots DLP may be disposed around the hole h. The dots DLP may be disposed to surround the hole h.

First dots DLP1 may be disposed around at least one of the first plurality of holes h. For example, the number of the first dots DLP1 may be eight, or any other variation of numbers and the eight first dots DLP1 may be sequentially positioned around the hole h while maintaining a constant interval.

Second dots DLP2 may be disposed around at least one of the second plurality of holes h. For example, the number of second dots DLP2 may be eight, or any other variation of numbers, and the eight second dots DLP2 may be sequentially positioned around the hole h while maintaining a constant interval.

Third dots DLP3 may be disposed around at least one of the plurality of third holes h. For example, the number of third dots DLP3 may be eight, or any other variation of numbers, and the eight third dots DLP3 may be sequentially positioned around the hole h while maintaining a constant interval.

Fourth dots DLP4 may be disposed around at least one of the plurality of fourth holes h. For example, the number of fourth dots DLP4 may be three or four, or any other variation of numbers, and four fourth dots DLP4 may be sequentially positioned around the hole h while maintaining a constant interval. The number of dots DLP4 around the hole h adjacent to the cut line CL1 may be three. The dot DLP4 may be excluded from an area adjacent to the cut line CL1 around the hole h.

For example, the size of the first dot DLP1 may be greater than the size of the second dot DLP2. The size of the second dot DLP2 may be greater than the size of the third dot DLP3. The size of the third dot DLP3 may be greater than the size of the fourth dot DLP4. As another example, the sizes of the first dot DLP1, the second dot DLP2, the third dot DLP3, and the fourth dot DLP4 may have the same size. When the sizes of the dots DLP are the same, the number of dots DLP may increase.

The light pattern LP may include a plurality of segments LP. The plurality of segments LP may be an elongated line. Each of the plurality of lines LP may be positioned to correspond to each of the plurality of holes h. The plurality of lines LP may be positioned between the first plurality of holes h and the first side S1 and/or the fourth side S4. The plurality of lines LP may be positioned between the first dots DA1 and the first side S1 and/or the fourth side S4.

For example, the length of the line LP may correspond to the diameter of the hole h. As another example, the length of the line LP may be smaller than the diameter of the hole h. As another example, the length of the line LP may be greater than the diameter of the hole h.

The description of the second corner C2 may be applied to other corners C1, C3, and C4.

Figure 13:
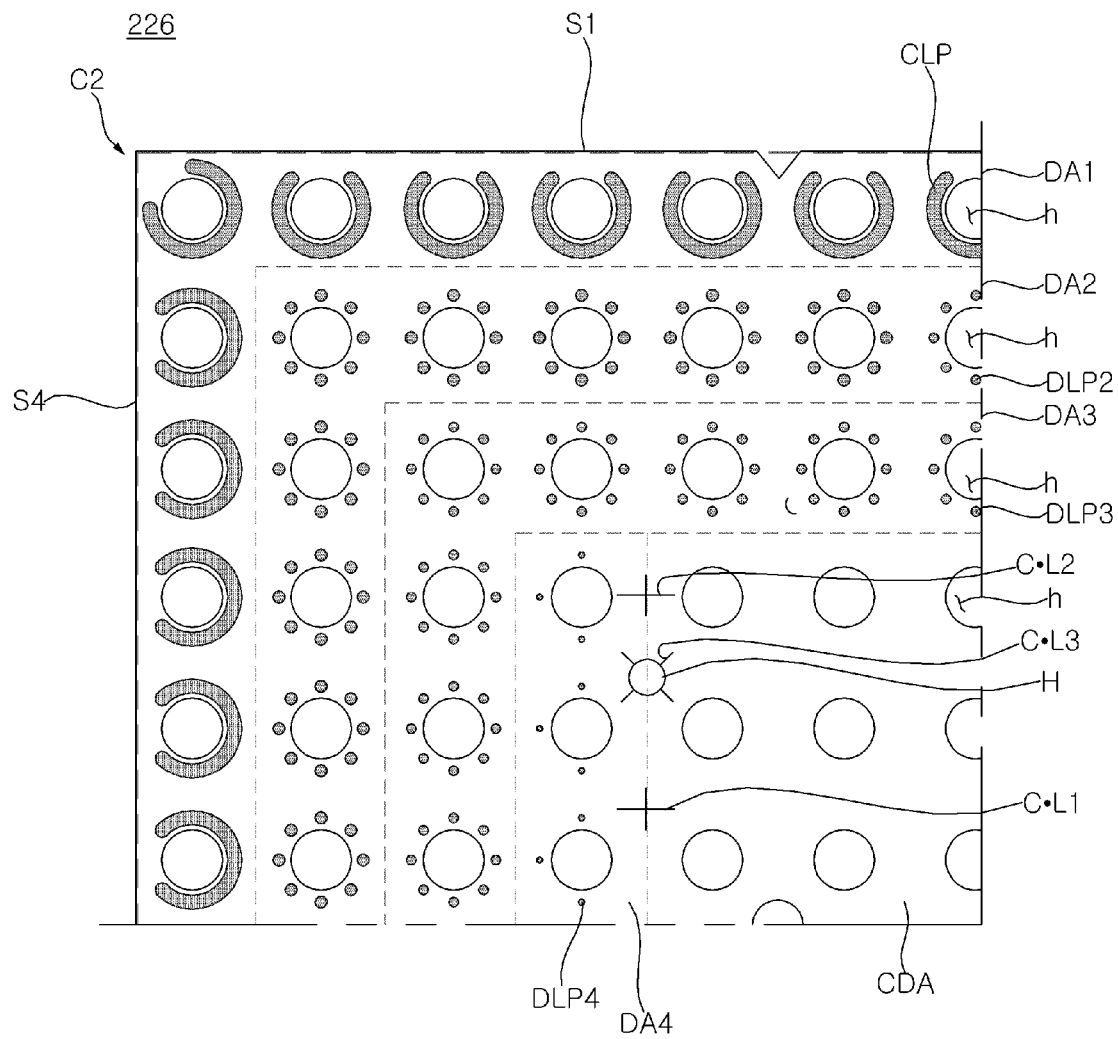

Referring to FIG. 13, the reflective sheet 226 may include a first area DA1, a second area DA2, a third area DA3, a fourth area DA4, and a central area CDA. The area DA may be referred to as a dot area DA or a pattern area DA.

The first area DA1 may be formed to be elongated along the first side S1 and/or the fourth side S4. The first plurality of holes h may be sequentially formed in the first area DA1 while maintaining a constant interval. The first area DA1 may be in contact with the first side S1 and/or the fourth side S4. The description of the first side S1 and/or the fourth side S4 may be applied to other sides S2 and S3.

The second area DA2 may be formed to be elongated along the first side S1 and/or the fourth side S4. The second plurality of holes h may be sequentially formed in the second area DA2 while maintaining a constant interval. The second area DA2 may be in contact with or adjacent to the first area DA1. The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The third area DA3 may be formed to be elongated along the first side S1 and/or the fourth side S4. A third plurality of holes h may be sequentially formed in the third area DA3 while maintaining a constant interval. The third area DA3 may be in contact with or adjacent to the second area DA2. The distance of the third area DA3 from the first side S1 and/or the fourth side S4 may be greater than the distance of the second area DA2 from the first side S1 and/or the fourth side S4. The second area DA2 may be positioned between the third area DA3 and the first area DA1.

The fourth area DA4 may be formed to be elongated along the fourth side S4. A fourth plurality of holes h may be sequentially formed in the fourth area DA4 while maintaining a constant interval. The fourth area DA4 may be in contact with or adjacent to the third area DA3. The distance of the fourth area DA4 from the first side S1 and/or the fourth side S4 may be greater than the distance of the third area DA3 from the first side S1 and/or the fourth side S4. The third area DA3 may be positioned between the fourth area DA4 and the second area DA2.

The central area CDA may be an area of the reflective sheet 226 excluding the first area DA1, the second area DA2, the third area DA3, and the fourth area DA4.

The light pattern DLP, CLP may include a phosphor. The light pattern DLP, CLP may include a red-based phosphor and a green-based phosphor. The light pattern DLP, CLP may include a yellow-based phosphor.

For example, the light pattern DLP, CLP may have a yellow-based color, with the naked eye. The light pattern DLP, CLP may convert blue-based light provided by the light source 224 (refer to FIG. 5) or the optical assembly 224 into white light.

As another example, the light pattern DLP, CLP may have black or gray-based color, with the naked eye. The light pattern DLP, CLP may absorb light provided by the light source 224 (refer to FIG. 5) or the optical assembly 224.

The light pattern DLP may include dots DLP. The dots DLP may be disposed around the hole h. The dots DLP may be disposed to surround the hole h.

The curved line CLP may be disposed around at least one hole h among the first plurality of holes h. The curved line CLP may have a ring shape as a whole. The curved line CLP may be elongated along the external circumference of the hole h. A portion of the curved line CLP may be opened. The open portion of the curved line CLP may face the first side S1 or the fourth side S4.

Second dots DLP2 may be disposed around at least one of the second plurality of holes h. For example, the number of second dots DLP2 may be eight, or any other variation of numbers, and the eight second dots DLP2 may be sequentially positioned around the hole h while maintaining a constant interval.

Third dots DLP3 may be disposed around at least one of the plurality of third holes h. For example, the number of third dots DLP3 may be eight, or any other variation of numbers, and the eight third dots DLP3 may be sequentially positioned around the hole h while maintaining a constant interval.

Fourth dots DLP4 may be disposed around at least one of the plurality of fourth holes h. For example, the number of fourth dots DLP4 may be three or four, or any other variation of numbers, and four fourth dots DLP4 may be sequentially positioned around the hole h while maintaining a constant interval. The number of dots DLP4 around the hole h adjacent to the cut line CL1, CL2, CL3 may be three. The dot DLP4 may be excluded from an area adjacent to the cut line CL1, CL2, CL3 around the hole h.

For example, the size of the second dot DLP2 may be greater than the size of the third dot DLP3. The size of the third dot DLP3 may be greater than the size of the fourth dot DLP4. As another example, the sizes of the second dot DLP2, the third dot DLP3, and the fourth dot DLP4 may have the same size. When the sizes of the dots DLP are the same, the number of dots DLP may increase.

The description of the second corner C2 may be applied to other corners C1, C3, and C4.

Figure 14:
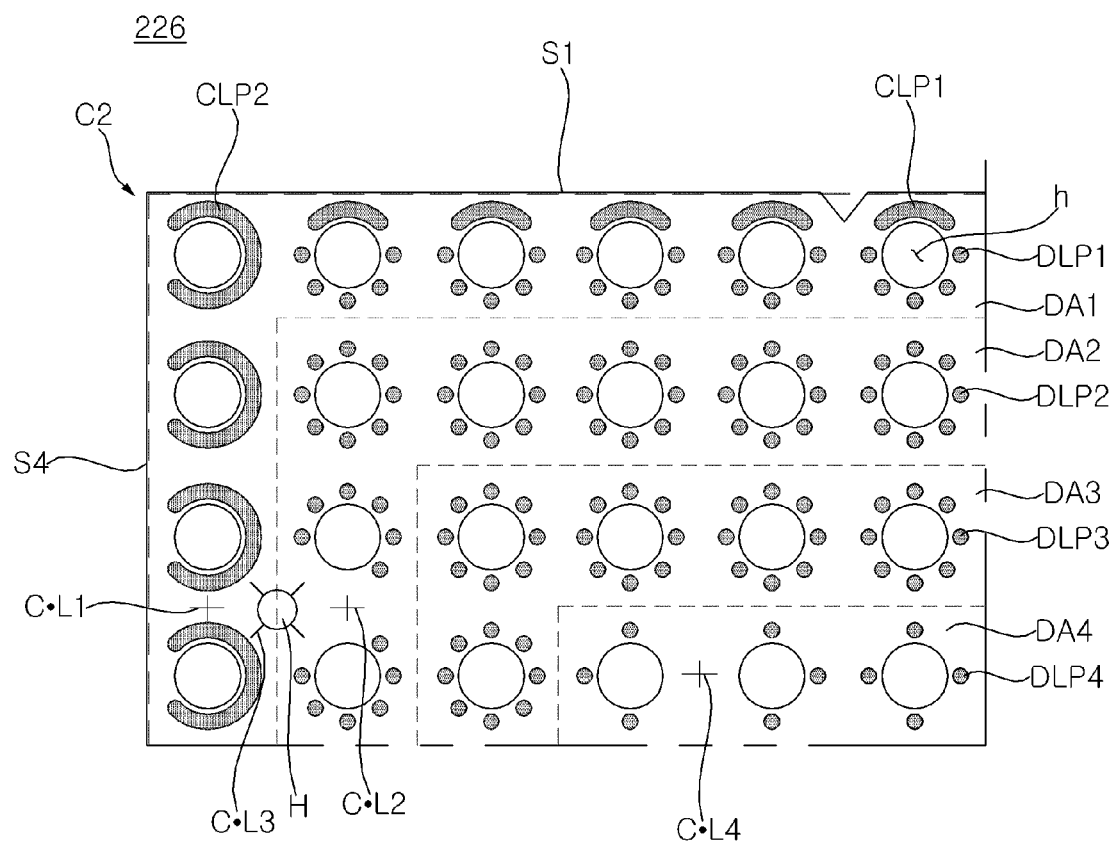

Referring to FIG. 14, the reflective sheet 226 may include a first area DA1, a second area DA2, a third area DA3, and a fourth area DA4. The area DA may be referred to as a dot area DA or a pattern area DA.

The first area DA1 may be formed to be elongated along the first side S1 and/or the fourth side S4. The first plurality of holes h may be sequentially formed in the first area DA1 while maintaining a constant interval. The first area DA1 may be in contact with the first side S1 and/or the fourth side S4. The description of the first side S1 and/or the fourth side S4 may be applied to other sides S2 and S3 (refer to FIG. 7).

The second area DA2 may be formed to be elongated along the first side S1 and/or the fourth side S4. The second plurality of holes h may be sequentially formed in the second area DA2 while maintaining a constant interval. The second area DA2 may be in contact with or adjacent to the first area DA1. The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The third area DA3 may be formed to be elongated along the first side S1 and/or the fourth side S4. A third plurality of holes h may be sequentially formed in the third area DA3 while maintaining a constant interval. The third area DA3 may be in contact with or adjacent to the second area DA2. The distance of the third area DA3 from the first side S1 and/or the fourth side S4 may be greater than the distance of the second area DA2 from the first side S1 and/or the fourth side S4. The second area DA2 may be positioned between the third area DA3 and the first area DA1.

The fourth area DA4 may be formed to be elongated along the first side S1. A fourth plurality of holes h may be sequentially formed in the fourth area DA4 while maintaining a constant interval. The fourth area DA4 may be in contact with or adjacent to the third area DA3. The distance of the fourth area DA4 from the first side S1 and/or the fourth side S4 may be greater than the distance of the third area DA3 from the first side S1 and/or the fourth side S4. The third area DA3 may be positioned between the fourth area DA4 and the second area DA2.

The light pattern DLP, CLP may include a phosphor. The light pattern DLP, CLP may include a red-based phosphor and a green-based phosphor. The light pattern DLP, CLP may include a yellow-based phosphor.

For example, the light pattern DLP, CLP may have a yellow-based color, with the naked eye. The light pattern DLP, CLP may convert blue-based light provided by the light source 224 (refer to FIG. 5) or the optical assembly 224 into white light.

As another example, the light pattern DLP, CLP may have black or gray-based color, with the naked eye. The light pattern DLP, CLP may absorb light provided by the light source 224 (refer to FIG. 5) or the optical assembly 224.

The light pattern DLP may include dots DLP. The dots DLP may be disposed around the hole h. The dots DLP may be disposed to surround the hole h.

The curved line CLP may be disposed around at least one hole h among the first plurality of holes h. The curved line CLP may have a ring shape, a semicircle shape, or a fan shape as a whole. The curved line CLP may be elongated in an arc along the external circumference of the hole h. A portion of the curved line CLP may be opened. The open portion of the curved line CLP may face the fourth side S4. The curved line CLP may be formed adjacent to the first side S1.

In the hole h adjacent to the first side S1, the curved line CLP1 may be positioned between the hole h and the first side S1. The dots DLP1 may be positioned opposite to the curved line CLP1 with respect to the hole h. For example, the arc formed by the dots DLP1 may be larger than the arc formed by the curved line CLP1. As another example, five dots DLP1 may be disposed around the hole h, and the curved line CLP1 may be disposed in the remaining area. The curvature of the arc formed by the five dots DLP1 may be the same as the curvature of the arc formed by the curved line CLP1. In the hole h adjacent to the fourth side S4, the curved line CLP2 may be disposed around the hole h, and the open portion of the curved line CLP2 may face the fourth side S4. The width of the curved line CLP2 adjacent to the fourth side S4 may be substantially the same as the width of the curved line CLP1 adjacent to the first side S1.

Second dots DLP2 may be disposed around at least one of the second plurality of holes h. For example, the number of second dots DLP2 may be eight, or any other variation of numbers, and the eight second dots DLP2 may be sequentially positioned around the hole h while maintaining a constant interval. The number of dots DLP2 around the hole h adjacent to the cut line CL2 may be six. A dot DLP2 may be excluded from an area adjacent to the cut line CL2 around the hole h.

Third dots DLP3 may be disposed around at least one of the plurality of third holes h. For example, the number of third dots DLP3 may be eight, or any other variation of numbers, and the eight third dots DLP3 may be sequentially positioned around the hole h while maintaining a constant interval.

Fourth dots DLP4 may be disposed around at least one of the plurality of fourth holes h. For example, the number of fourth dots DLP4 may be three or four, or any other variation of numbers, and four fourth dots DLP4 may be sequentially positioned around the hole h while maintaining a constant interval. The number of dots DLP4 around the hole h adjacent to the cut line CL4 may be three. The dot DLP4 may be excluded from an area adjacent to the cut line CL4 around the hole h.

For example, the size of the second dot DLP2 may be greater than the size of the third dot DLP3. The size of the third dot DLP3 may be greater than the size of the fourth dot DLP4. As another example, the sizes of the second dot DLP2, the third dot DLP3, and the fourth dot DLP4 may have the same size. When the sizes of the dots DLP are the same, the number of dots DLP may increase.

The description of the second corner C2 may be applied to other corners C1, C3, and C4.

Figure 15:
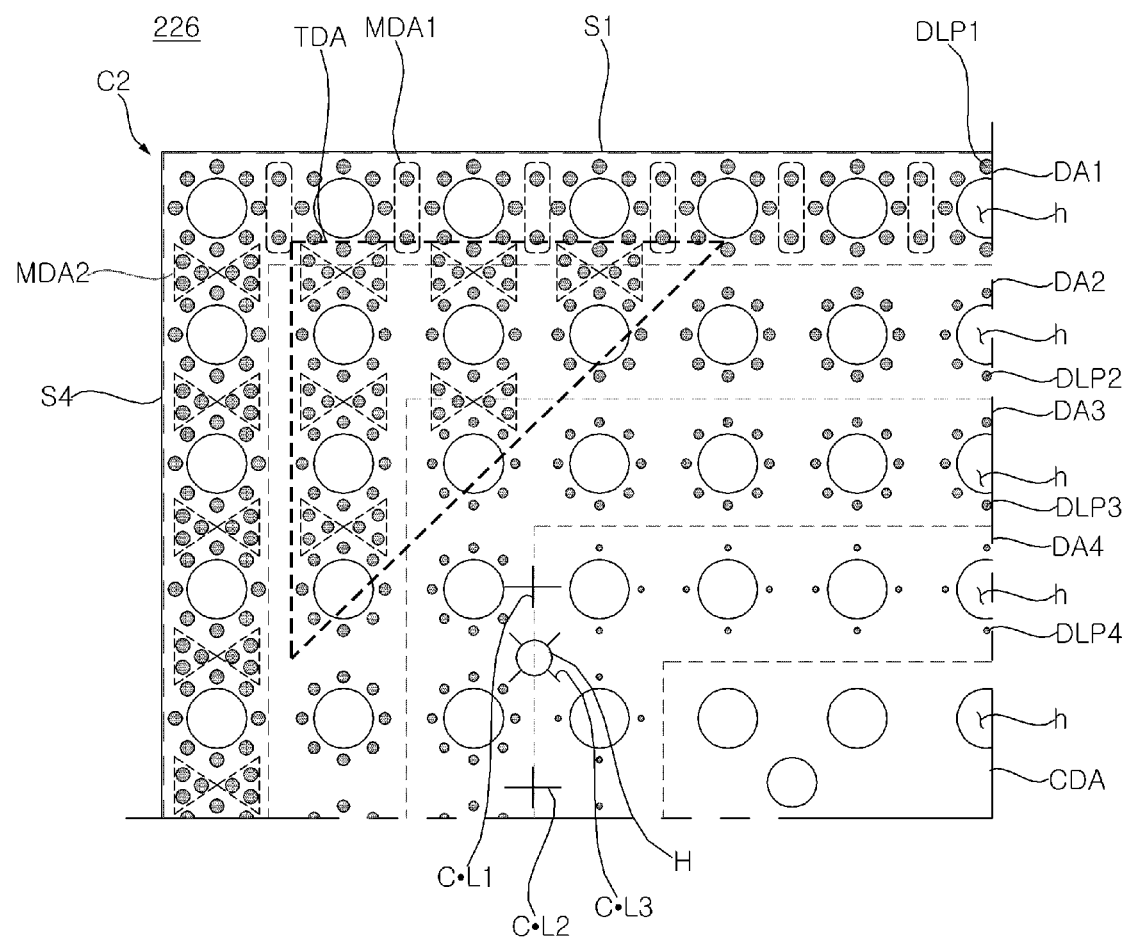

Referring to FIG. 15, the reflective sheet 226 may include a first area DA1, a second area DA2, a third area DA3, a fourth area DA4, a central area CDA, an intermediate area MDA1, MDA2, and a triangular area TDA. The area DA may be referred to as a dot area DA or a pattern area DA.

The first area DA1 may be formed to be elongated along the first side S1 and/or the fourth side S4. The first plurality of holes h may be sequentially formed in the first area DA1 while maintaining a constant interval. The first area DA1 may be in contact with the first side S1 and/or the fourth side S4. The description of the first side S1 and/or the fourth side S4 may be applied to other sides S2 and S3 (refer to FIG. 7).

The second area DA2 may be formed to be elongated along the first side S1 and/or the fourth side S4. The second plurality of holes h may be sequentially formed in the second area DA2 while maintaining a constant interval. The second area DA2 may be in contact with or adjacent to the first area DA1. The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The third area DA3 may be formed to be elongated along the first side S1 and/or the fourth side S4. A third plurality of holes h may be sequentially formed in the third area DA3 while maintaining a constant interval. The third area DA3 may be in contact with or adjacent to the second area DA2. The distance of the third area DA3 from the first side S1 and/or the fourth side S4 may be greater than the distance of the second area DA2 from the first side S1 and/or the fourth side S4. The second area DA2 may be positioned between the third area DA3 and the first area DA1.

The fourth area DA4 may be formed to be elongated along the first side S1 and/or the fourth side S4. A fourth plurality of holes h may be sequentially formed in the fourth area DA4 while maintaining a constant interval. The fourth area DA4 may be in contact with or adjacent to the third area DA3. The distance of the fourth area DA4 from the first side S1 and/or the fourth side S4 may be greater than the distance of the third area DA3 from the first side S1 and/or the fourth side S4. The third area DA3 may be positioned between the fourth area DA4 and the second area DA2.

The central area CDA may be an area of the reflective sheet 226 excluding the first area DA1, the second area DA2, the third area DA3, and the fourth area DA4.

The light pattern DLP may include a phosphor. The light pattern DLP may include a red-based phosphor and a green-based phosphor. The light pattern DLP may include a yellow-based phosphor.

For example, the light pattern DLP may have a yellow-based color, with the naked eye. The light pattern DLP may convert blue-based light provided by the light source 224 (refer to FIG. 5) or the optical assembly 224 into white light.

As another example, the light pattern DLP may have black or gray-based color, with the naked eye. The light pattern DLP may absorb light provided by the light source 224 (refer to FIG. 5) or the optical assembly 224.

The light pattern DLP may include dots DLP. The dots DLP may be disposed around the hole h. The dots DLP may be disposed to surround the hole h.

First dots DLP1 may be disposed around at least one of the first plurality of holes h. For example, the number of first dots DLP1 may be eight, or any other variation of numbers, and the eight first dots DLP1 may be sequentially positioned around the hole h while maintaining a constant interval.

Second dots DLP2 may be disposed around at least one of the second plurality of holes h. For example, the number of second dots DLP2 may be eight, or any other variation of numbers, and the eight second dots DLP2 may be sequentially positioned around the hole h while maintaining a constant interval.

Third dots DLP3 may be disposed around at least one of the plurality of third holes h. For example, the number of third dots DLP3 may be eight, or any other variation of numbers, and the eight third dots DLP3 may be sequentially positioned around the hole h while maintaining a constant interval.

Fourth dots DLP4 may be disposed around at least one of the plurality of fourth holes h. For example, the number of fourth dots DLP4 may be three or four, or any other variation of numbers, and four fourth dots DLP4 may be sequentially positioned around the hole h while maintaining a constant interval. The number of dots DLP4 around the hole h adjacent to the cut line CL1 may be three, or any other variation of numbers. The dot DLP4 may be excluded from an area adjacent to the cut line CL1 around the hole h.

For example, the size of the first dot DLP1 may be greater than the size of the second dot DLP2. The size of the second dot DLP2 may be greater than the size of the third dot DLP3. The size of the third dot DLP3 may be greater than the size of the fourth dot DLP4.

As another example, the sizes of the first dot DLP1, the second dot DLP2, the third dot DLP3, and the fourth dot DLP4 may have the same size. When the sizes of the dots DLP are the same, the number of dots DLP may increase.

The intermediate area MDA1 may be positioned between the first plurality of holes h. The intermediate area MDA1 may be formed between the first plurality of holes h adjacent to the first side S1. The intermediate area MDA1 may be formed to extend longitudinally in a direction of intersecting with or being perpendicular to the length direction of the first side S1. The dots DLP1 may be disposed in the intermediate area MDA1. For example, a plurality of dots DLP1 may be disposed in the length direction of the intermediate area MDA1. For example, the number of dots DLP1 may be two, or any other variation of numbers.

The intermediate area MDA2 may be positioned between the first plurality of holes h. The intermediate area MDA2 may be formed between the first plurality of holes h adjacent to the fourth side S4. A plurality of intermediate areas MDA2 may be formed between the first plurality of holes h adjacent to the fourth side S4. The region having the intermediate area MDA2 may form a triangle. The dots DLP1 may be disposed in the intermediate area MDA2. For example, a plurality of dots DLP1 may be disposed in the intermediate area MDA2. For example, the number of dots DLP1 may be three, or any other variation of numbers.

The intermediate area MDA2 may be positioned between the second plurality of holes h. The intermediate area MDA2 may be formed between the second plurality of holes h adjacent to the fourth side S4. A plurality of intermediate areas MDA2 may be formed between the second plurality of holes h adjacent to the fourth side S4. The intermediate area MDA2 may form a triangle. The dots DLP2 may be disposed in the intermediate area MDA2. For example, a plurality of dots DLP2 may be disposed in the intermediate area MDA2. For example, the number of dots DLP2 may be three, or any other variation of numbers.

The intermediate area MDA2 may be formed between the first area DA1 and the second area DA2. The intermediate area MDA2 may be formed between the second area DA2 and the third area DA3. The intermediate area MDA2 may form a triangular area TDA as a whole throughout the second area DA2 and the third area DA3.

The description of the second corner C2 may be applied to other corners C1, C3, and C4.

Figure 16:
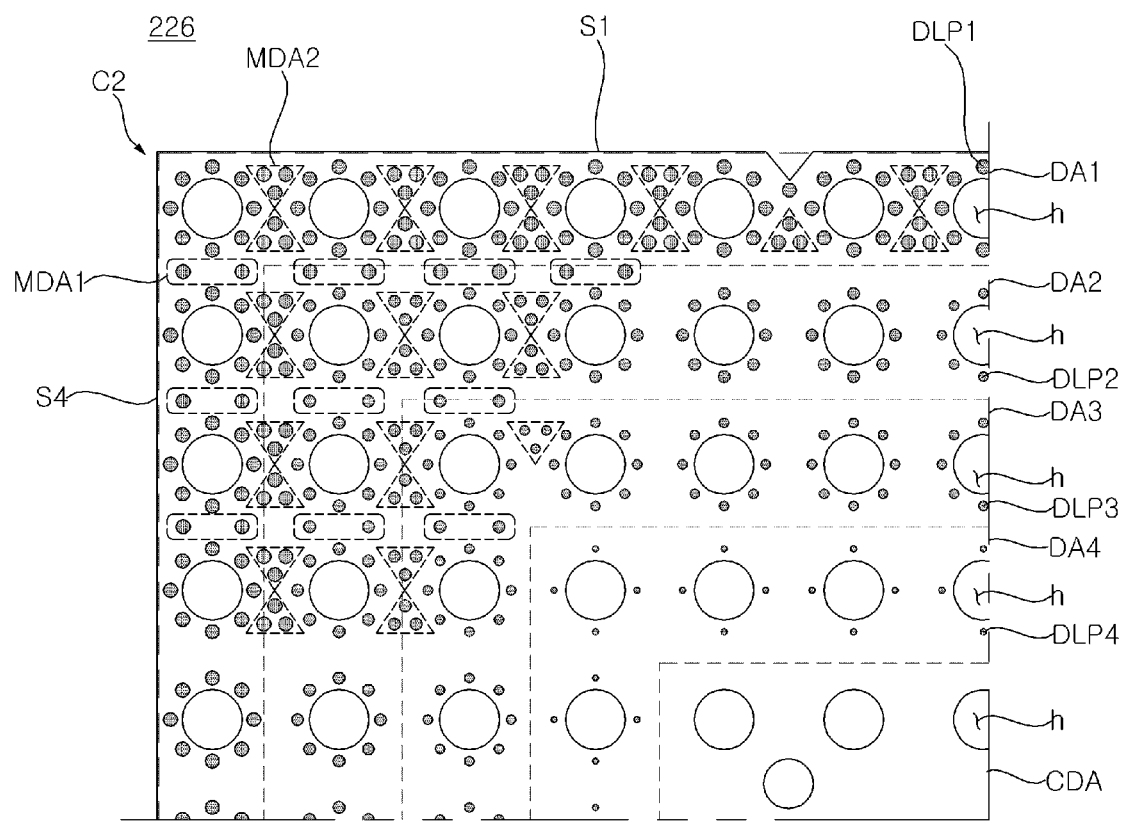

Referring to FIG. 16, the reflective sheet 226 may include a first area DA1, a second area DA2, a third area DA3, a fourth area DA4, a central area CDA, and an intermediate area MDA1, MDA2. The area DA may be referred to as a dot area DA or a pattern area DA.

The first area DA1 may be formed to be elongated along the first side S1 and/or the fourth side S4. The first plurality of holes h may be sequentially formed in the first area DA1 while maintaining a constant interval. The first area DA1 may be in contact with the first side S1 and/or the fourth side S4. The description of the first side S1 and/or the fourth side S4 may be applied to other sides S2 and S3 (refer to FIG. 7).

The second area DA2 may be formed to be elongated along the first side S1 and/or the fourth side S4. The second plurality of holes h may be sequentially formed in the second area DA2 while maintaining a constant interval. The second area DA2 may be in contact with or adjacent to the first area DA1. The distance of the second area DA2 from the first side S1 and/or the fourth side S4 may be greater than the distance of the first area DA1 from the first side S1 and/or the fourth side S4. The first area DA1 may be positioned between the second area DA2 and the first side S1 and/or the fourth side S4.

The third area DA3 may be formed to be elongated along the first side S1 and/or the fourth side S4. A third plurality of holes h may be sequentially formed in the third area DA3 while maintaining a constant interval. The third area DA3 may be in contact with or adjacent to the second area DA2. The distance of the third area DA3 from the first side S1 and/or the fourth side S4 may be greater than the distance of the second area DA2 from the first side S1 and/or the fourth side S4. The second area DA2 may be positioned between the third area DA3 and the first area DA1.

The fourth area DA4 may be formed to be elongated along the first side S1 and/or the fourth side S4. A fourth plurality of holes h may be sequentially formed in the fourth area DA4 while maintaining a constant interval. The fourth area DA4 may be in contact with or adjacent to the third area DA3. The distance of the fourth area DA4 from the first side S1 and/or the fourth side S4 may be greater than the distance of the third area DA3 from the first side S1 and/or the fourth side S4. The third area DA3 may be positioned between the fourth area DA4 and the second area DA2.

The central area CDA may be an area of the reflective sheet 226 excluding the first area DA1, the second area DA2, the third area DA3, and the fourth area DA4.

The light pattern DLP may include a phosphor. The light pattern DLP may include a red-based phosphor and a green-based phosphor. The light pattern DLP may include a yellow-based phosphor.

For example, the light pattern DLP may have a yellow-based color, with the naked eye. The light pattern DLP may convert blue-based light provided by the light source 224 (refer to FIG. 5) or the optical assembly 224 into white light.

As another example, the light pattern DLP may have black or gray-based color, with the naked eye. The light pattern DLP may absorb light provided by the light source 224 (refer to FIG. 5) or the optical assembly 224.

The light pattern DLP may include dots DLP. The dots DLP may be disposed around the hole h. The dots DLP may be disposed to surround the hole h.

First dots DLP1 may be disposed around at least one of the first plurality of holes h. For example, the number of first dots DLP1 may be eight, or any other variation of numbers, and the eight first dots DLP1 may be sequentially positioned around the hole h while maintaining a constant interval.

Second dots DLP2 may be disposed around at least one of the second plurality of holes h. For example, the number of second dots DLP2 may be eight, or any other variation of numbers, and the eight second dots DLP2 may be sequentially positioned around the hole h while maintaining a constant interval.

Third dots DLP3 may be disposed around at least one of the plurality of third holes h. For example, the number of third dots DLP3 may be eight, or any other variation of numbers, and the eight third dots DLP3 may be sequentially positioned around the hole h while maintaining a constant interval.

Fourth dots DLP4 may be disposed around at least one of the plurality of fourth holes h. For example, the number of fourth dots DLP4 may be four, or any other variation of numbers, and four fourth dots DLP4 may be sequentially positioned around the hole h while maintaining a constant interval.

For example, the size of the first dot DLP1 may be greater than the size of the second dot DLP2. The size of the second dot DLP2 may be greater than the size of the third dot DLP3. The size of the third dot DLP3 may be greater than the size of the fourth dot DLP4.

As another example, the sizes of the first dot DLP1, the second dot DLP2, the third dot DLP3, and the fourth dot DLP4 may have the same size. When the sizes of the dots DLP are the same, the number of dots DLP may increase.

The intermediate area MDA1 may be positioned between the first plurality of holes h. The intermediate area MDA1 may be formed between the first plurality of holes h adjacent to the fourth side S4. The intermediate area MDA1 may be formed to extend long in a direction of intersecting with or being perpendicular to the length direction of the fourth side S4. The dots DLP1 may be disposed in the intermediate area MDA1. For example, a plurality of dots DLP1 may be disposed in the length direction of the intermediate area MDA1. For example, the number of dots DLP1 may be two.

The intermediate area MDA2 may be positioned between the first plurality of holes h. The intermediate area MDA2 may be formed between the first plurality of holes h adjacent to the first side S1. A plurality of intermediate areas MDA2 may be formed between the first plurality of holes h adjacent to the first side S1. The intermediate area MDA2 may form a triangle. The dots DLP1 may be disposed in the intermediate area MDA2. For example, a plurality of dots DLP1 may be disposed in the intermediate area MDA2. For example, the number of dots DLP1 may be three.

The intermediate area MDA1 may be positioned between the second plurality of holes h. The intermediate area MDA1 may be formed between the second plurality of holes h adjacent to the fourth side S4. The intermediate area MDA1 may be formed to extend longitudinally in a direction of intersecting with or being perpendicular to the length direction of the fourth side S4. The dots DLP2 may be disposed in the intermediate area MDA1. For example, a plurality of dots DLP2 may be disposed in the length direction of the intermediate area MDA1. For example, the number of dots DLP2 may be three, or any other variation of numbers.

The intermediate area MDA2 may be positioned between the second plurality of holes h. The intermediate area MDA2 may be formed between the plurality of second holes h adjacent to the first side S1. A plurality of intermediate areas MDA2 may be formed between a second plurality of holes h adjacent to the first side S1. The intermediate area MDA2 may form a triangle. The dots DLP2 may be disposed in the intermediate area MDA2. For example, a plurality of dots DLP2 may be disposed in the intermediate area MDA2. For example, the number of dots DLP2 may be three, or any other variation of numbers.

The intermediate area MDA1 may be positioned between the third plurality of holes h. The intermediate area MDA1 may be formed between the third plurality of holes h adjacent to the fourth side S4. The intermediate area MDA1 may be formed to extend long in a direction of intersecting with or being perpendicular to the length direction of the fourth side S4. The dots DLP3 may be disposed in the intermediate area MDA1. For example, a plurality of dots DLP3 may be disposed in the length direction of the intermediate area MDA1. For example, the number of dots DLP3 may be two, or any other variation of numbers.

The intermediate area MDA2 may be positioned between the third plurality of holes h. The intermediate area MDA2 may be formed between the third plurality of holes h adjacent to the first side S1. A plurality of intermediate areas MDA2 may be formed between the third plurality of holes h adjacent to the first side S1. The intermediate area MDA2 may form a triangle. The dots DLP3 may be disposed in the intermediate area MDA2. For example, a plurality of dots DLP3 may be disposed in the intermediate area MDA2. For example, the number of dots DLP3 may be three, or any other variation of numbers.

The intermediate area MDA2 may be formed between the first area DA1 and the second area DA2. The intermediate area MDA2 may be formed between the second area DA2 and the third area DA3.

The description of the second corner C2 may be applied to other corners C1, C3, and C4.

Figure 17:
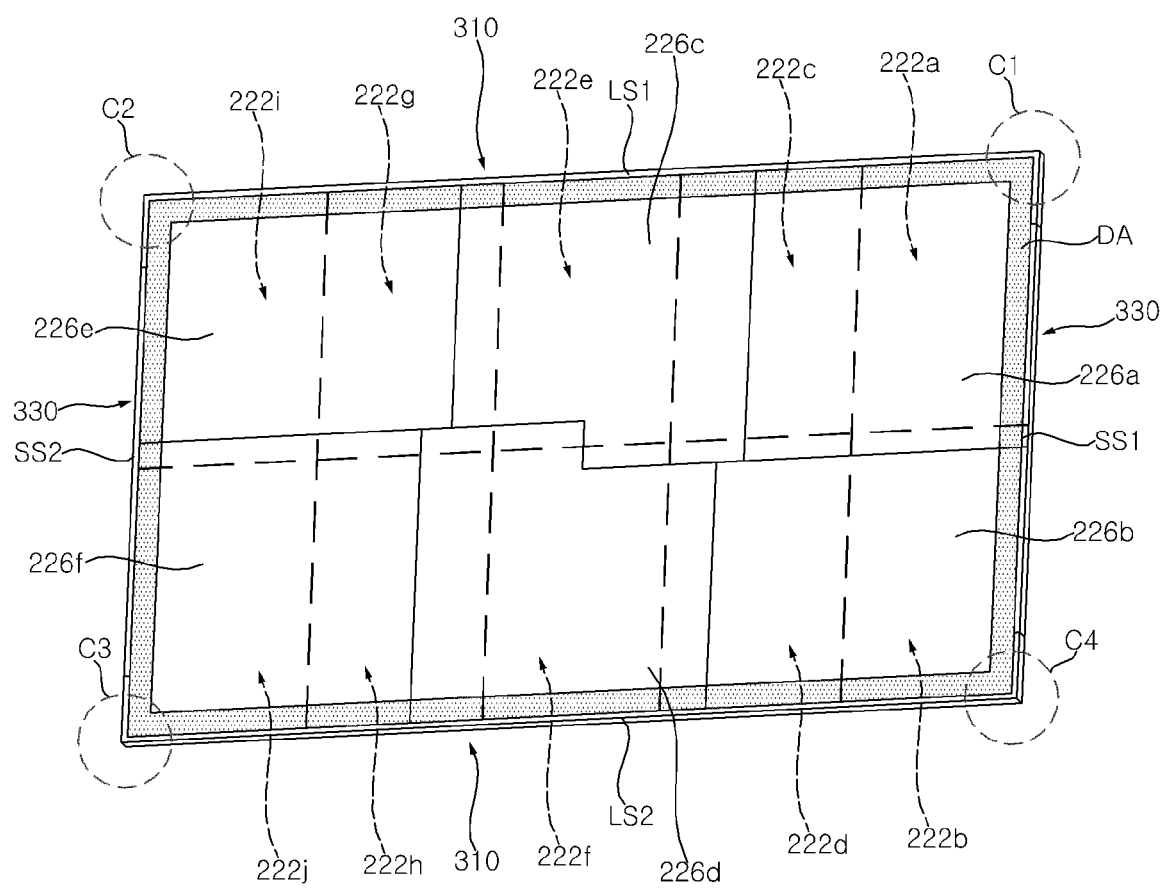
FIGS. 17 to 30 are diagrams illustrating examples of a coupling structure of a display device according to embodiments of the present disclosure.

Referring to FIG. 17, an inner frame 310, 330 may be coupled to sides LS1, LS2, SS1, SS2 or edges LS1, LS2, SS1, SS2 of the rear frame 130. The inner frame 310, 330 may include a plurality of parts 310 and 330. A first part 310 may be coupled to the first long side LS1 of the rear frame 130. A second part 310 may be coupled to the second long side LS2 of the rear frame 130. A third part 330 may be coupled to the first short side SS1 of the rear frame 130. A fourth part 330 may be coupled to the second short side SS2 of the rear frame 130. The first part 310 may be coupled to the third part 330 and the fourth part 330, and the second part 310 may be coupled to the third part 330 and the fourth part 330. The first part 310, the second part 310, the third part 330, or the fourth part 330 may be referred to as inner frame 310, 330.

Figure 18:
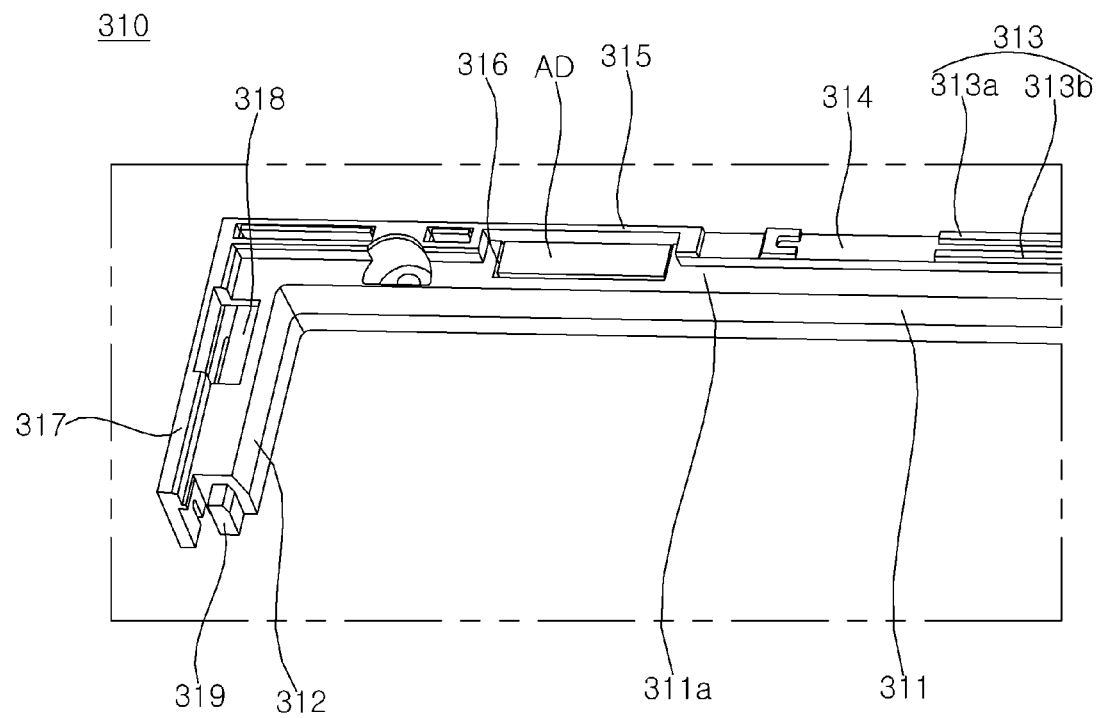
Figure 19:
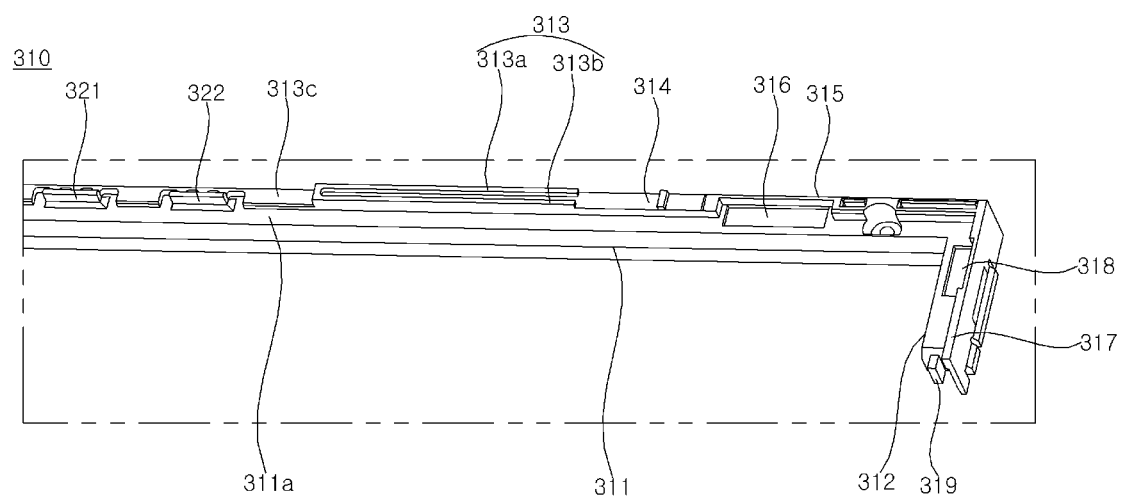

Referring to FIGS. 18 and 19, the inner frame 310 may be elongated, and may have a curved bar shape at both ends. A center part 311 may be elongated, and may have a rectangular cross-section. A support surface 311a may form one surface of the center part 311. A frame wall 313 may protrude from the support surface 311a, and may be elongated along the length direction of the center part 311. A plurality of frame walls 313 may be formed side by side. A first framewall 313a may be spaced apart from a second framewall 313b.

An accommodation portion 314 may be formed on a frame wall 313. The accommodation portion 314 may provide a flat surface to the upper end of the frame wall 313. The length of the accommodation portion 314 may be smaller than the length of the frame wall 313. A recessed portion 316 may be formed on the support surface 311a. The recessed portion 316 may be formed while forming a step that is lowered from the support surface 311a. A cover wall 315 may be positioned at one side of the recessed portion 316. The cover wall 315 may extend along an alignment line of the first frame wall 313a. A pad AD or an adhesive pad AD may be fixed to the recessed portion 316, and the pad AD or the adhesive pad AD may support the optical layer 129 (refer to FIG. 3).

The side part 312 may extend while being bent or angled from one or both ends of the center part 311. The support surface 311a may be formed at one surface of the side part 312. A coupling rib 319 may protrude from one end of the side part 312. The recessed portion 318 may form a step that is lowered from the support surface 311a of the side part 312. The cover wall 317 may be positioned at one side of the recessed portion 318 of the side part 312, and may be connected to the cover wall 315 of the center part 311.

Figure 20:
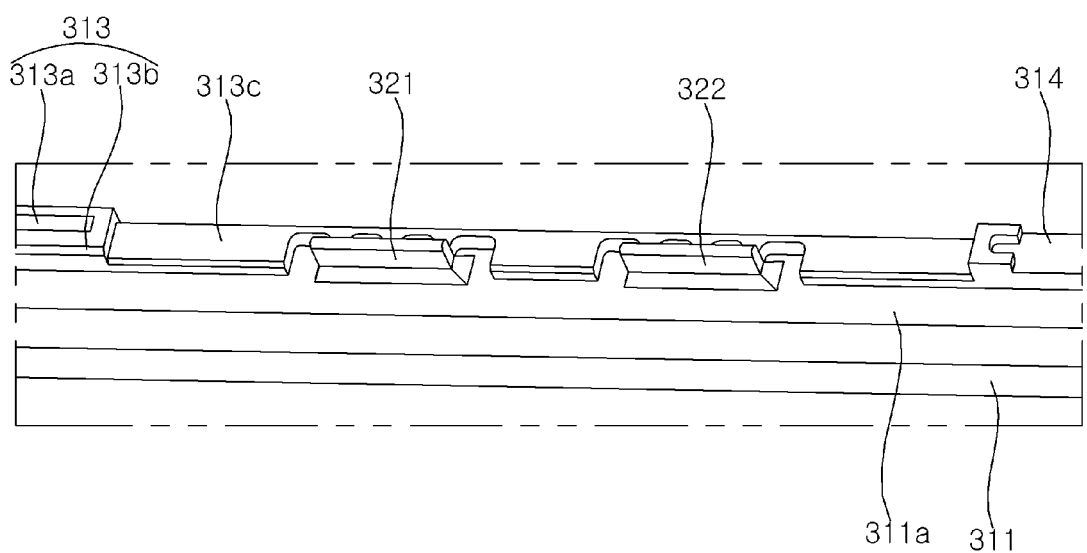

Referring to FIGS. 19 and 20, a coupling rib 321, 322 may protrude from the support surface 311a of the center part 311, and there may be a plurality of coupling ribs 321 and 322. A first coupling rib 321 may protrude from the support surface 311a of the center part 311, and may be elongated in the length direction of the center part 311. A second coupling rib 322 may be positioned adjacent to the first coupling rib 321, and may extend along an alignment line of the first coupling rib 321.

A third framewall 313c may extend from the first framewall 313a and/or the second framewall 313b. The third frame wall 313c may be positioned adjacent to the first coupling rib 321 and the second coupling rib 322, and may be in contact with one edge of the center part 311. The height of the third framewall 313c may be smaller than the height of the first framewall 313a and/or the second framewall 313b.

Figure 21:
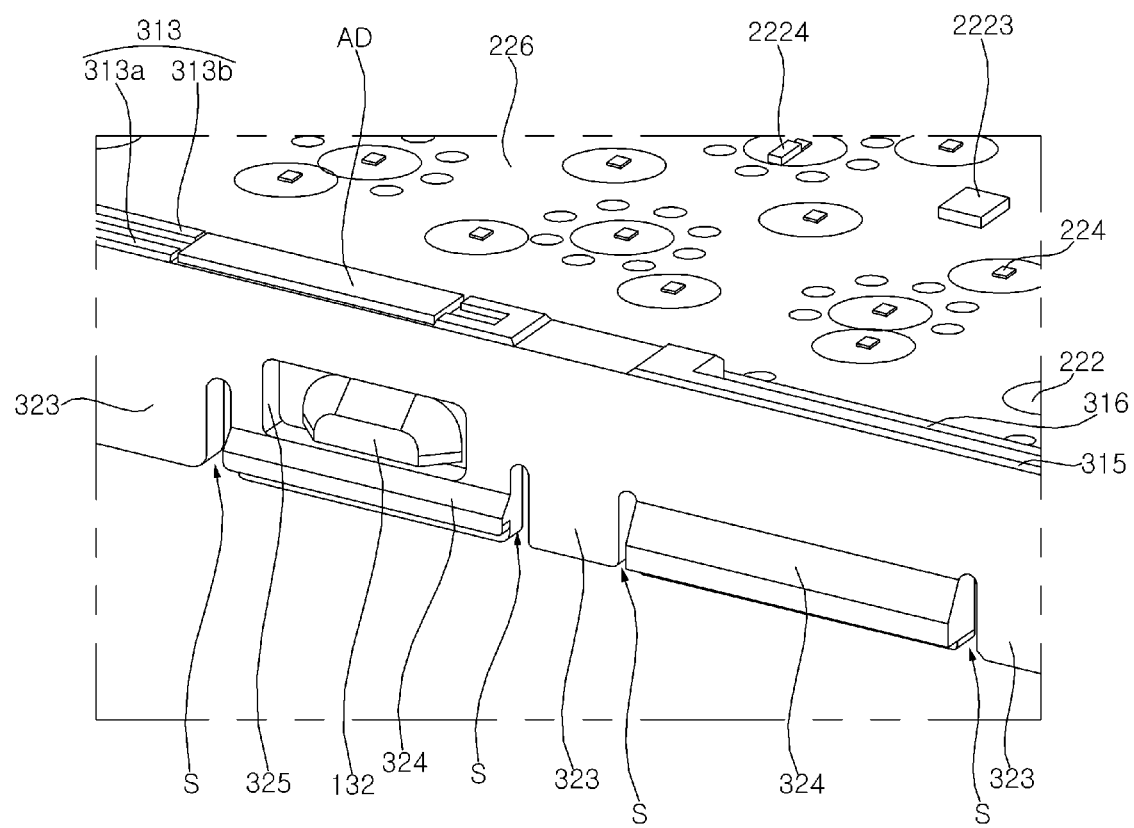

Referring to FIG. 21 together with FIG. 19, the inner frame 310 may include a middle coupler 324, 325. The middle coupler 324, 325 may be positioned at the outer surface of the center part 311. The middle coupler 324, 325 may be one of a plurality of middle couplers. The first middle coupler 324 may be defined by slots S or slits S formed by cutting-out an outer surface 323 of the center part 311.

A first middle coupler 324, 325 may include a locking protrusion 324 protruding from the outer surface 323 of the center part 311. The locking protrusion 324 may be formed adjacent to a lower distal end of the first middle coupler 324, 325. A coupling hole 325 may pass through the first middle coupler 324, 325 and be formed between the support surface 311a and the locking protrusion 324. A protrusion 132 of the frame 130 may be inserted and secured into the coupling hole 325 of the first middle coupler 324, 325.

A second middle coupler 324 may be positioned adjacent to the first middle coupler 324, 325 along the length direction of the center part 311. The second middle coupler 324 may include a locking protrusion 324 protruding from the outer surface of the center part 311. The locking protrusion 324 may be formed adjacent to a lower distal end of the second middle coupler 324.

The pad AD or the adhesive pad AD may be positioned in or fixed to the accommodation portion 314.

Figure 22:
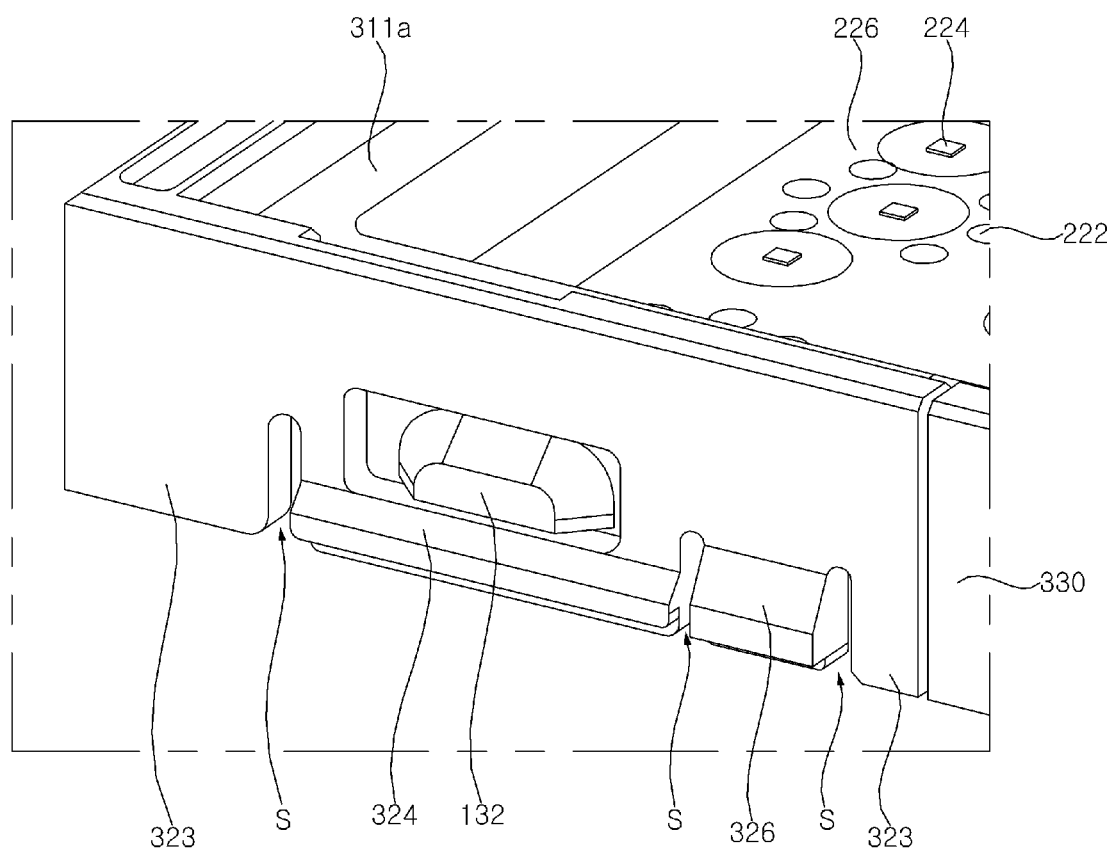

Referring to FIG. 22 together with FIG. 19, the inner frame 310 may include a side middle coupler 324, 325, 326. The side middle coupler 324, 325, 326 may be positioned at the outer surface of the side part 312. The side middle coupler 324, 325, 326 may be one of a plurality of side middle couplers. The side middle coupler 324, 325 may be defined by slots S formed by cutting out the outer surface 323 of the side part 312.

A third middle coupler 324, 325 may include a locking protrusion 324 protruding from the outer surface 323 of the side part 312. The locking protrusion 324 may be formed adjacent to a lower distal end of the third middle coupler 324, 325. The coupling hole 325 may pass through the third middle coupler 324, 325 and be formed between the support surface 311a and the locking protrusion 324. The protrusion 132 of the frame 130 may be inserted and secured into the coupling hole 325 of the third middle coupler 324, 325.

A fourth middle coupler 326 may be positioned adjacent to the third middle coupler 324, 325 along the length direction of the side part 312. The fourth middle coupler 326 may include a locking protrusion 326 protruding from the outer surface 323 of the side part 312. The locking protrusion 326 may be formed adjacent to a lower distal end of the fourth middle coupler 326. One slot S may be formed between the third middle coupler 324, 325 and the fourth middle coupler 326.

Figure 23:
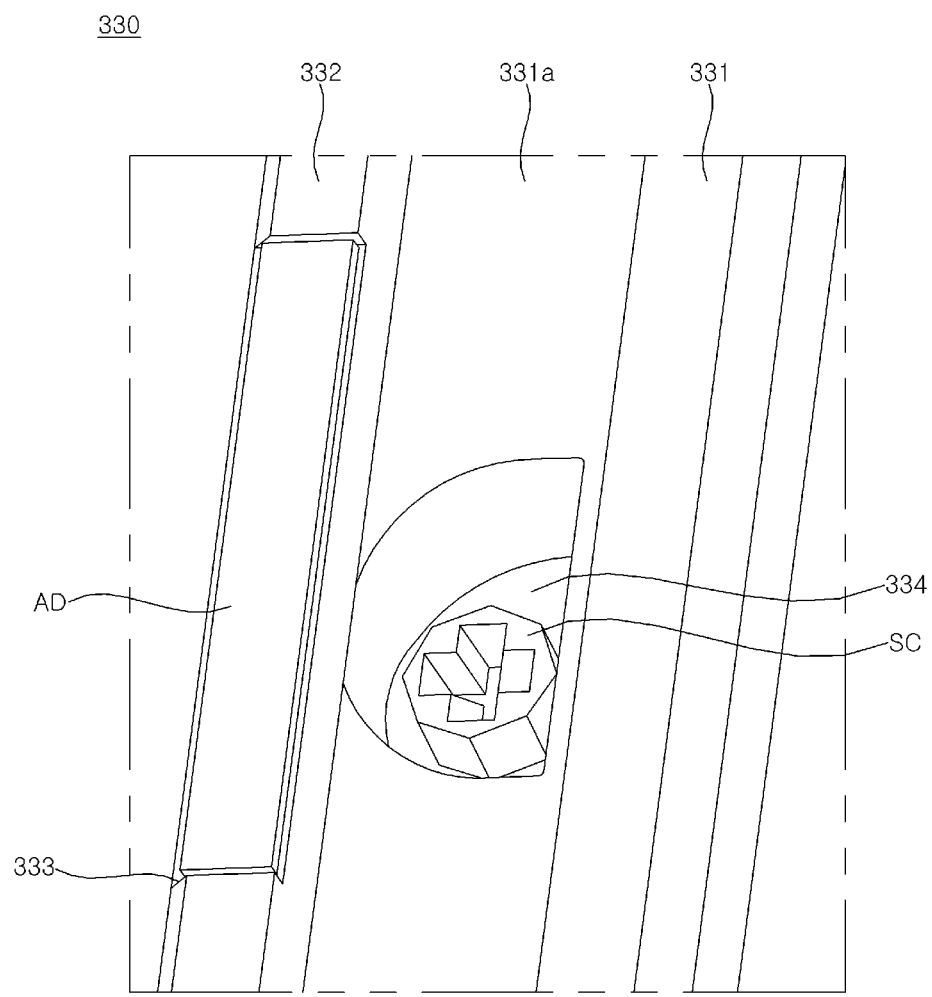

Referring to FIG. 23, the inner frame 330, 331 may include a support surface 331a and a sidewall 332. The support surface 331a may form one surface of the third part 331 and/or the fourth part 331 of the inner frame 330, 331. A coupling groove 334 may be formed in the support surface 331a of the inner frame 330, 331. The rear frame 130 and the inner frame 330 may be coupled by a screw SC inserted into the coupling groove 334. An accommodation portion 333 may be formed by recessing or cutting out the upper surface of the sidewall 332. The pad AD or the adhesive pad AD may be positioned on or fixed to the accommodation portion 333.

Figure 24:
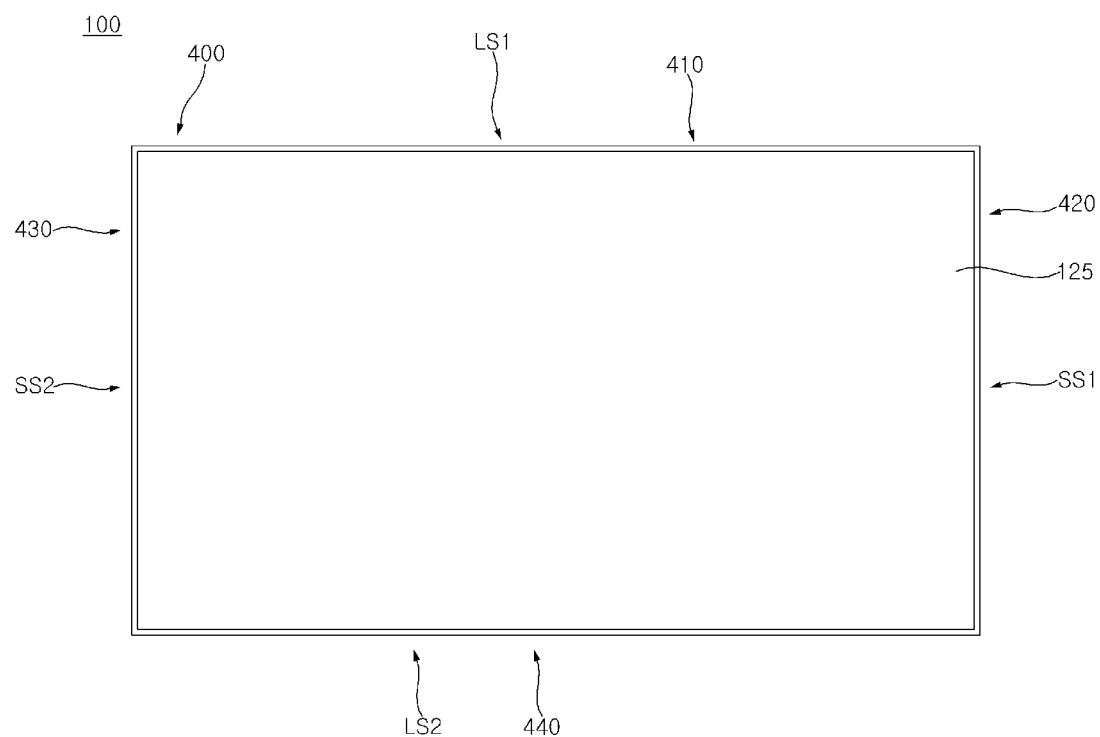
Figure 25:
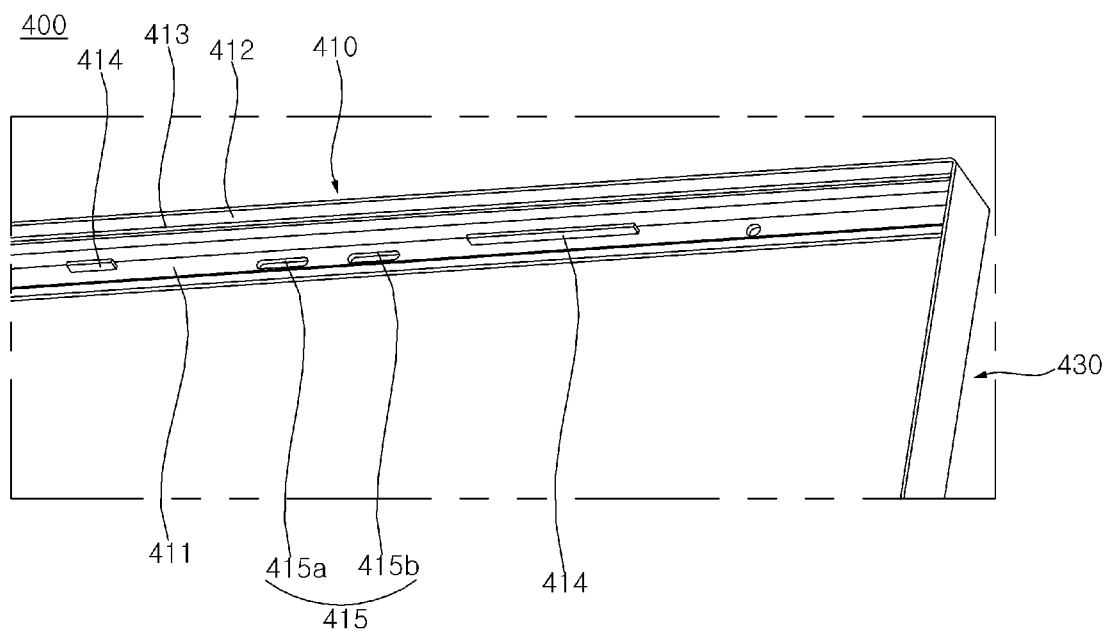
Figure 26:
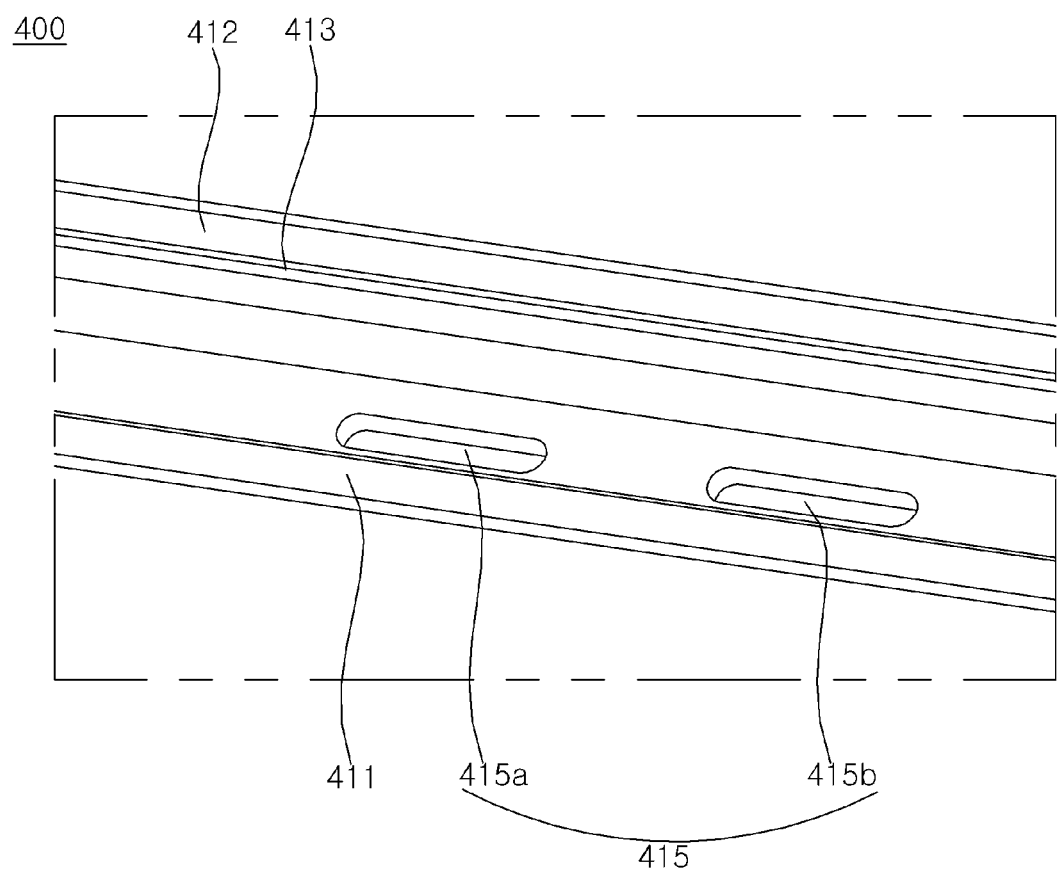

Referring to FIGS. 24 to 26, the optical layer 123 may be placed on the inner frame 310, 330. An outer frame 400 may be coupled to the inner frame 310, 330 while covering the periphery of the optical layer 123. The outer frame 400 may be referred to as a guide panel 400. The outer frame 410, 420, 430 may be coupled to the first short side SS1, the first long side LS1, and/or the second short side SS2 while the elongated frame 400 is bent. A separate outer frame 440 may be coupled to the second long side LS2.

A first part 410 of the outer frame 400 may include a horizontal portion 411 and a vertical portion 412. The description of the first part 410 may be applied to the second part 420 and/or the third part 430. The horizontal portion 411 may have an elongated plate or planar shape. The vertical portion 412 may have a plate or planar shape that is elongated and bent or angled from the horizontal portion 411. A rib hole 415 may be formed in the horizontal portion 411. There may be a plurality of rib holes 415. A first rib hole 415a may be an elongated long hole. A second rib hole 415b may be an elongated hole, and may be disposed along the length direction of the first rib hole 415a. The rib holes 415 may be formed to penetrate the horizontal portion 411.

A guide rib 414 may protrude from the horizontal portion 411 and may be elongated. The guide rib 414 may be parallel to the vertical portion 412. The rib holes 415 may be positioned between the guide ribs 414. The hook line 413 may be formed at the vertical portion 412. The hook line 413 may be adjacent to the guide rib 414 or facing the guide rib 414.

Figure 27:
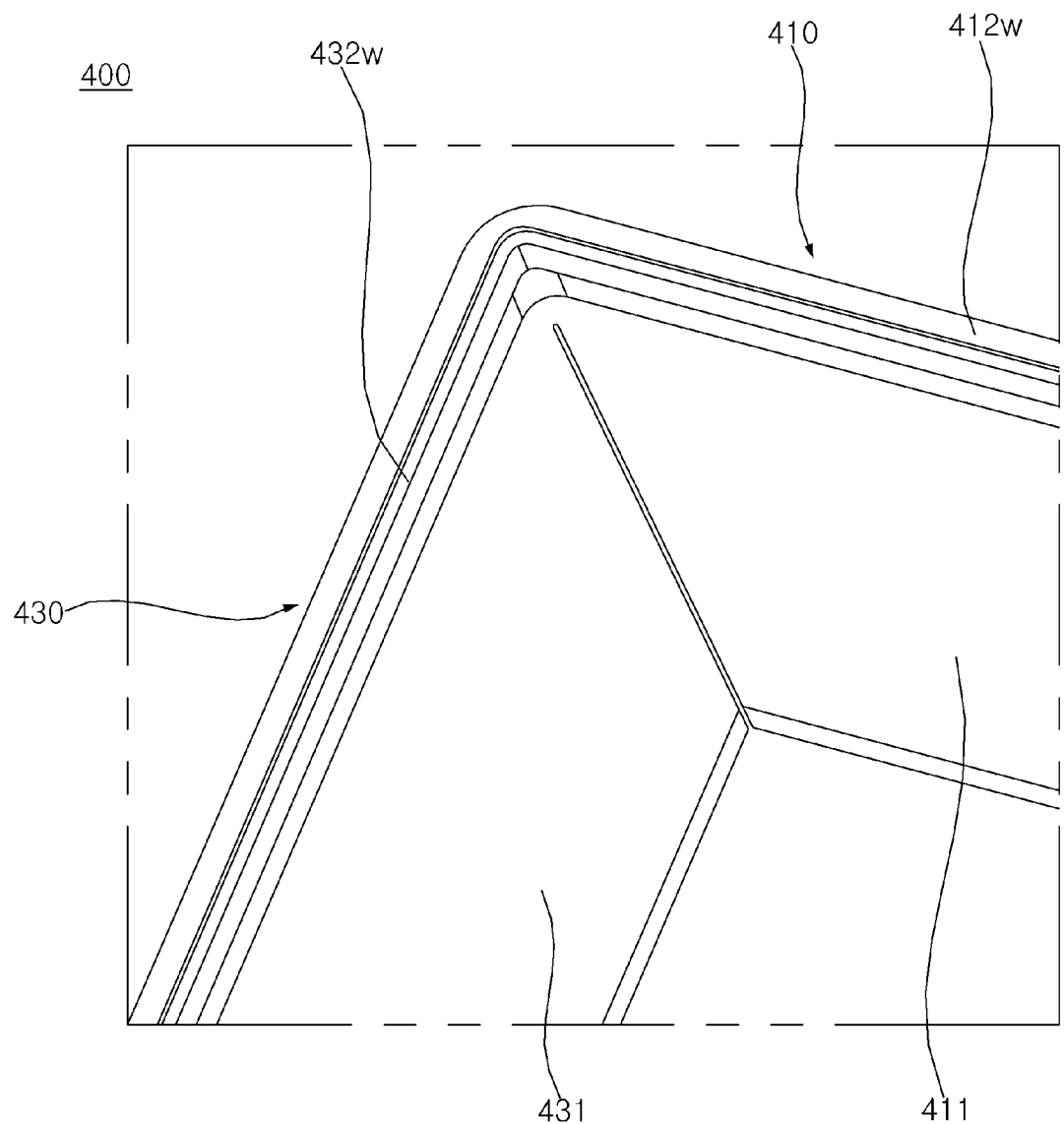

Referring to FIG. 27, the first part 410 may include a horizontal portion 411 and a vertical wall 412W. The vertical wall 412W may be formed at a constant height from the horizontal portion 411. The third part 430 may include a horizontal portion 431 and a vertical wall 432W. The vertical wall 432W may be formed at a constant height from the horizontal portion 431.

The vertical wall 412W of the first part 411 may be connected to the vertical wall 432W of the third part 430. A corner formed by the vertical wall 412W of the first part 411 and the vertical wall 432W of the third part 430 may be rounded. The vertical wall 412W of the first part 410 may form a gap with the vertical wall 432W of the third part 430.

Figure 28:
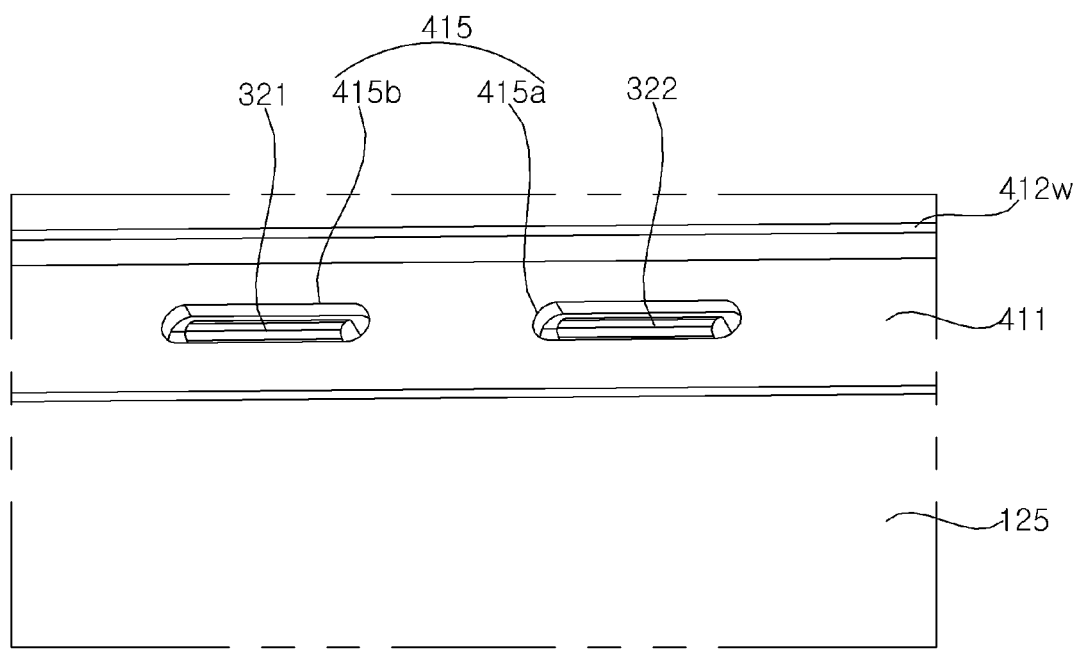
Figure 29:
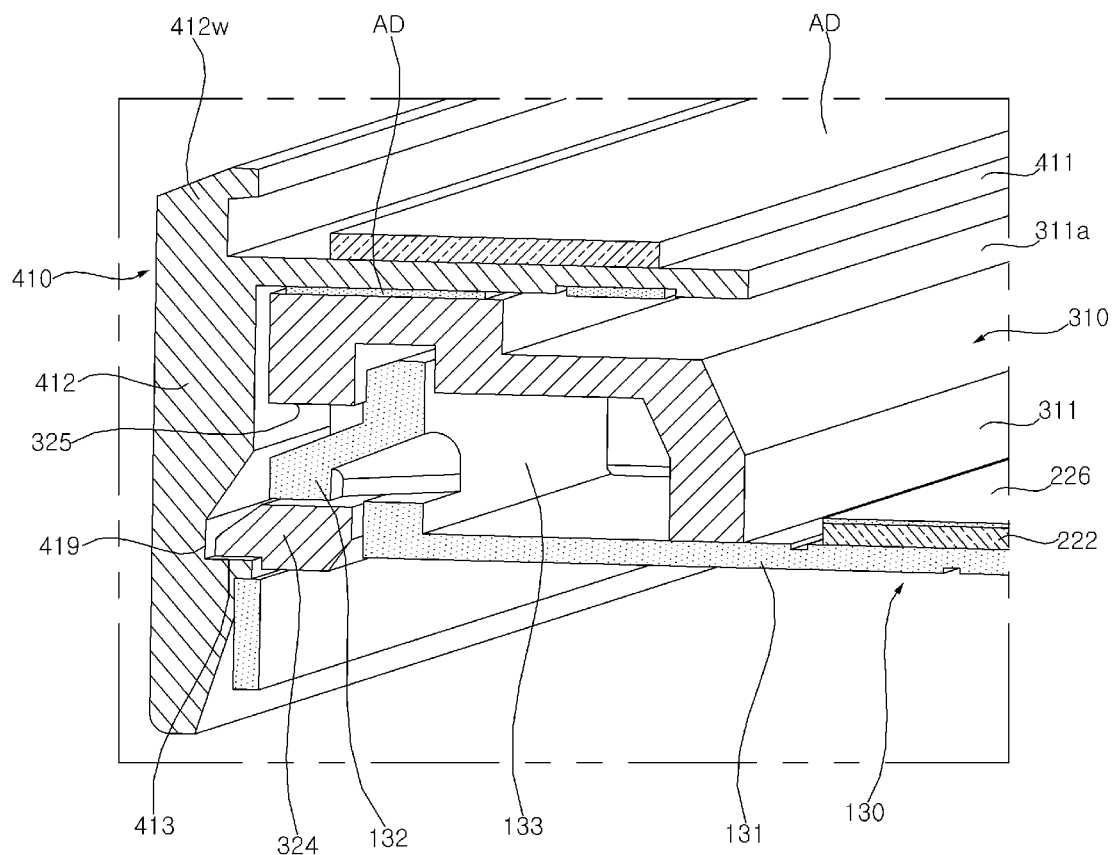

Referring to FIGS. 28 and 29, the outer frame 400 may be coupled to the rear frame 130 and/or the inner frame 310, 330 (refer to FIG. 17) while covering the optical sheet 125. The horizontal portion 411 of the outer frame 400 may be placed on the optical sheet 125, and the coupling ribs 321 and 322 to which the optical sheet 125 is coupled may be inserted into the rib hole 415.

The pad AD or the adhesive member AD may be positioned in or fixed to the horizontal portion 411 of the outer frame 400. For example, the pad AD may be a double-sided tape having a constant thickness. The display panel 110 (refer to FIG. 30) may be placed on the outer frame 400 and fixed to the horizontal portion 411 by the pad AD.

Figure 30:
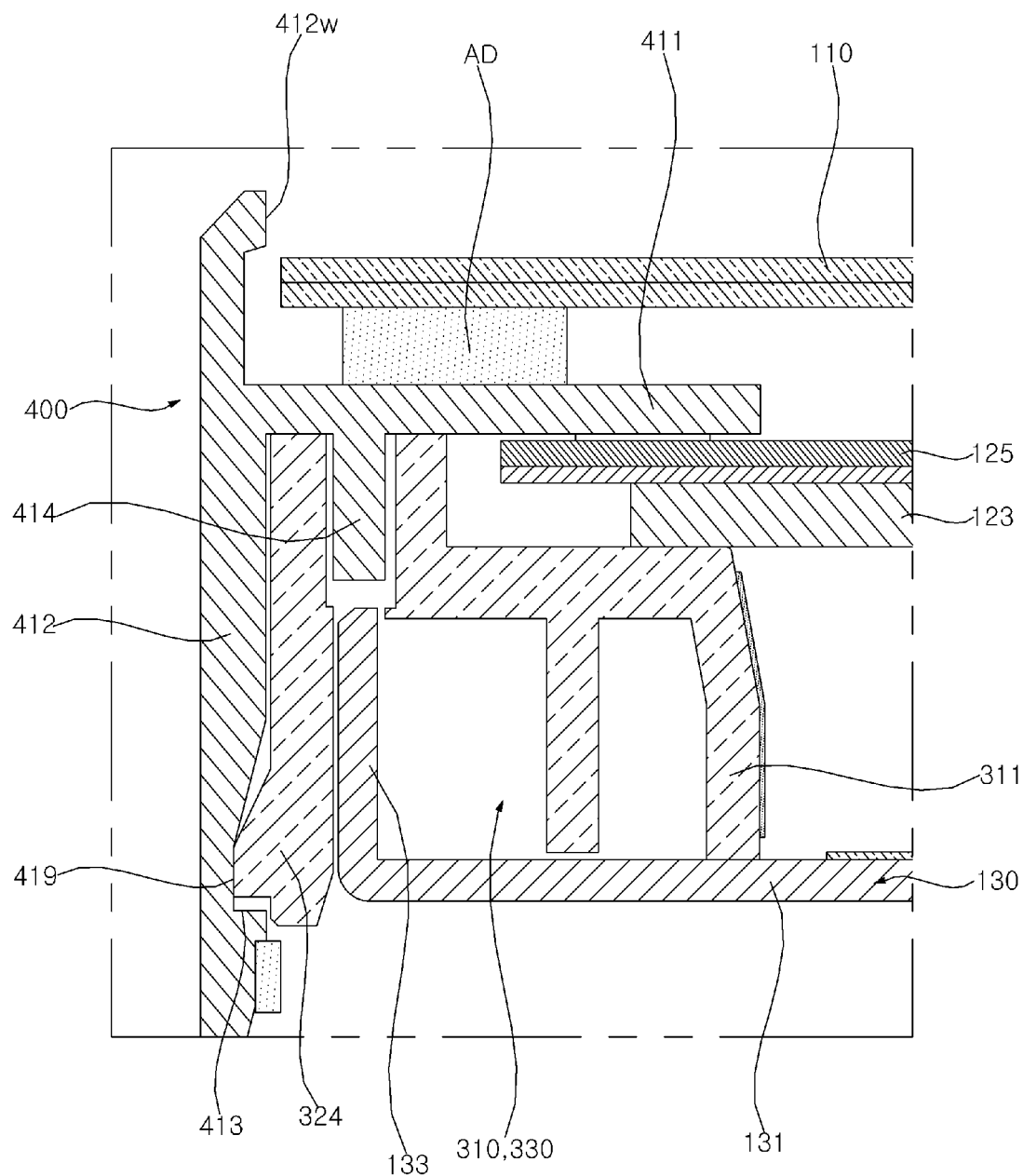

Referring to FIGS. 29 and 30, the center frame 311 of the inner frame 310 may be coupled to one side of the rear frame 130. A distal end of the bent rear frame 130 may be inserted into the center frame 311 of the inner frame 310. The protrusion 132 protruding to the outside of the rear frame 130 may be inserted into the coupling hole 325 of the inner frame 310.

The outer frame 410 may include a line groove 419. The line groove 419 may be formed at the vertical portion 412 of the outer frame 410. The locking protrusion 324 of the inner frame 310 may be inserted into the line groove 419 of the outer frame 410. The locking protrusion 324 of the inner frame 310 may be engaged with a hook line 413 of the outer frame 410.

The guide rib 414 of the outer frame 410 may be inserted into the inner frame 310. The guide rib 414 may be inserted into and fixed to the inner frame 310 while the outer frame 410 is placed on the inner frame 310.

The optical layer 123 and the optical sheet 125 may be placed on the support surface 311a of the inner frame 310, and may be positioned between the support surface 311a of the inner frame 310 and the horizontal portion 411 of the outer frame 410. The display panel 110 may be placed on the horizontal portion 411 of the outer frame 410, and the vertical wall 412W may cover the side surface of the display panel 110.

Referring to FIGS. 1 to 30, a display device according to an aspect of the present disclosure includes: a display panel 110; a rear frame 130 which is positioned in a rearward direction of the display panel 110; an inner frame 310 which is positioned between the display panel 110 and the rear frame 130, and coupled to the rear frame 130; and an outer frame 400 which is coupled to the inner frame 310, and supports a rear surface of the display panel 110.

According to another aspect of the present disclosure, the rear frame 130 includes: a flat plate portion 131 facing the display panel 110; a vertical portion 133 which is bent and extended from the flat plate portion 131, and inserted into the inner frame 310; and a frame protrusion 132 protruding from the vertical portion 133, wherein the inner frame 310 includes a coupling hole 325 which faces the vertical portion 133 of the rear frame 130, and into which the frame protrusion 132 is inserted.

According to another aspect of the present disclosure, the inner frame 310 includes a locking protrusion 324 which is positioned adjacent to the coupling hole 325, and protrudes and extends from an outer surface 323 of the inner frame 310; wherein the outer frame 400 includes: a horizontal portion 411 which supports a rear surface of the display panel 110; a vertical portion 412 which extends in a direction intersecting with the horizontal portion 411, and faces the vertical portion 133 of the rear frame 130; and a line groove 419 which is recessed to be formed in the vertical portion 412, and into which the locking protrusion 324 of the inner frame 310 is inserted.

According to another aspect of the present disclosure, the outer frame 400 further includes a hook line 413 which is positioned adjacent to the line groove 419 and engaged with the locking protrusion 324 of the inner frame 310.

According to another aspect of the present disclosure, the inner frame 310 includes at least a pair of slits S which are formed by cutting out an outer surface of the inner frame 310, and face the coupling hole 325.

According to another aspect of the present disclosure, the inner frame 310 further includes: a support surface 311a facing the horizontal portion 411 of the outer frame 400; a frame wall 313 which is positioned between the support surface 311a and the display panel 110, and protrudes to be elongated from the support surface 311a; and an accommodation portion 316 formed in the frame wall 313.

According to another aspect of the present disclosure, the inner frame 310 further includes a pad AD which is fixed to the accommodation portion 316 and in contact with the horizontal portion 411 of the outer frame 400.

According to another aspect of the present disclosure, the inner frame 310 further includes a coupling rib 321 which protrudes from the support surface 311a and is elongated in a length direction of the inner frame 310, wherein the outer frame 400 further includes a rib hole 415 which is formed in the horizontal portion 411, and into which the coupling rib 321 is inserted.

According to another aspect of the present disclosure, the display device further includes an optical sheet which 125 is positioned between the inner frame 310 and the outer frame 400, and caught by the coupling rib 321.

According to another aspect of the present disclosure, the inner frame 310 further includes: a recessed portion 316 which is formed by recessing the support surface 311a of the inner frame 310; and a pad AD fixed to the recessed portion 316, and further includes an optical layer 123 which is positioned between the rear frame 130 and the display panel 110, and placed on the pad AD.

According to another aspect of the present disclosure, the outer frame 400 further includes a guide rib which protrudes from the horizontal portion of the outer frame 400 and is elongated in a length direction of the outer frame 400, wherein the guide rib of the outer frame 400 is inserted into the inner frame 310.

According to another aspect of the present disclosure, the guide rib 414 of the outer frame 400 is extended in parallel with a vertical portion 412 of the outer frame 400.

The effect of the display device according to the present disclosure is as follows.

According to at least one of the embodiments of the present disclosure, image quality of a display device can be improved.

According to at least one of the embodiments of the present disclosure, it is possible to provide a display device capable of improving luminance and light uniformity of the backlight unit.

According to at least one of the embodiments of the present disclosure, it is possible to provide a display device capable of effectively controlling light provided from the backlight unit.

According to at least one of the embodiments of the present disclosure, the purity of white light can be improved by improving the bluish phenomenon of light provided from the backlight unit.

According to at least one of the embodiments of the present disclosure, it is possible to provide a coupling structure of a display device capable of improving luminance and light uniformity.

According to at least one of the embodiments of the present disclosure, it is possible to provide a display device having a sturdy coupling structure while reducing an optical depth.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of the invention. More particularly, various variations and modifications are possible in the component parts and/or arrangements of the subject combination arrangement within the scope of the invention, the drawings and the appended claims. In addition to variations and modifications in the component parts and/or arrangements, alternative uses will also be apparent to those skilled in the art.

What is claimed is:

1. A display device comprising:
    a display panel;
    a rear frame at a rear of the display panel;
    an inner frame between the display panel and the rear frame, wherein the inner frame extends along an edge of the rear frame and is coupled to the rear frame;
    an outer frame extending along the inner frame, wherein the outer frame comprises a vertical portion facing an outer lateral side of the inner frame and a horizontal portion extending from the vertical portion between the display panel and the inner frame; and
    an optical layer positioned between the horizontal portion and the inner frame,
    wherein the inner frame comprises:
    a support surface facing the horizontal portion and spaced apart from the horizontal portion;
    a frame wall which protrudes from the support surface toward the horizontal portion and on which the horizontal portion is positioned; and
    a locking protrusion protruding from the outer lateral side of the inner frame and hooked to the vertical portion so that the horizontal portion is pressed toward the frame wall,
    wherein the optical layer is positioned between the horizontal portion and the support surface and is positioned on the support surface.

2. The display device of claim 1, wherein the rear frame comprises:
    a flat plate portion facing the display panel;
    a vertical portion extending from the flat plate portion; and
    a frame protrusion protruding from the vertical portion,
    wherein the inner frame comprises a coupling hole which faces the vertical portion of the rear frame and into which the frame protrusion is inserted.

3. The display device of claim 2,
    wherein the horizontal portion supports a rear surface of the display panel; and
    wherein the outer frame comprises a line groove formed to be recessed in the vertical portion and into which the locking protrusion of the inner frame is inserted.

4. The display device of claim 3, wherein the outer frame further comprises a hook line positioned adjacent to the line groove and configured to be engaged with the locking protrusion of the inner frame.

5. The display device of claim 2, wherein the inner frame comprises at least a pair of slits at an outer surface of the inner frame, wherein each slit is positioned opposite each other with respect to the coupling hole.

6. The display device of claim 3, wherein the inner frame further comprises
    an accommodation portion formed in the frame wall.

7. The display device of claim 6, wherein the inner frame further comprises a first pad fixed to the accommodation portion to contact the horizontal portion of the outer frame.

8. The display device of claim 6, wherein the inner frame further comprises a coupling rib protruding from the support surface and elongated in a length direction of the inner frame,
    wherein the outer frame further comprises a rib hole formed at the horizontal portion and into which the coupling rib is inserted.

9. The display device of claim 8, further comprising an optical sheet positioned between the inner frame and the outer frame, and secured by the coupling rib.

10. The display device of claim 6, wherein the inner frame further comprises:
   a recessed portion at the support surface of the inner frame; and
   a second pad fixed to the recessed portion,
   wherein the optical layer is disposed on the second pad.

11. The display device of claim 1, wherein the outer frame further comprises a guide rib protruding from the horizontal portion of the outer frame and elongated in a length direction of the outer frame,
   wherein the guide rib is inserted into the inner frame.

12. The display device of claim 11, wherein the guide rib of the outer frame extends to be parallel with a vertical portion of the outer frame.

* * * * *